United States Patent
Kwok et al.

(10) Patent No.: US 10,879,128 B2
(45) Date of Patent: Dec. 29, 2020

(54) SEMICONDUCTOR DEVICE AND METHOD OF FORMING SAME

(71) Applicant: Taiwan Semiconductor Manufacturing Company, Ltd., Hsinchu (TW)

(72) Inventors: Tsz-Mei Kwok, Hsinchu (TW); Tsung-Hsi Yang, Zhubei (TW); Jeng-Wei Yu, New Taipei (TW); Li-Wei Chou, Hsinchu (TW); Ming-Hua Yu, Hsinchu (TW); Chii-Horng Li, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 12 days.

(21) Appl. No.: 16/530,013

(22) Filed: Aug. 2, 2019

(65) Prior Publication Data

US 2020/0075423 A1 Mar. 5, 2020

Related U.S. Application Data

(60) Provisional application No. 62/726,151, filed on Aug. 31, 2018.

(51) Int. Cl.
*H01L 21/8234* (2006.01)
*H01L 27/088* (2006.01)
*H01L 21/764* (2006.01)
*H01L 29/66* (2006.01)

(52) U.S. Cl.
CPC .... *H01L 21/823481* (2013.01); *H01L 21/764* (2013.01); *H01L 21/823418* (2013.01); *H01L 21/823431* (2013.01); *H01L 27/0886* (2013.01); *H01L 29/66545* (2013.01)

(58) Field of Classification Search
CPC ..... H01L 21/823481; H01L 21/823431; H01L 27/0886; H01L 21/823418; H01L 21/764; H01L 29/66545; H01L 29/66795; H01L 21/823878; H01L 21/823814; H01L 21/823821; H01L 27/0924; H01L 27/0928
See application file for complete search history.

(56) References Cited

U.S. PATENT DOCUMENTS 10,177,093 B2 * 1/2019 Kim ................ H01L 21/76897
2018/0182845 A1 * 6/2018 Seong ............ H01L 21/823821

* cited by examiner

*Primary Examiner* — Karen Kusumakar
(74) *Attorney, Agent, or Firm* — Slater Matsil, LLP

(57) ABSTRACT

A semiconductor device includes a first semiconductor fin extending from a substrate, a first dielectric fin extending from the substrate adjacent a first side of the first semiconductor fin and a second dielectric fin extending from the substrate adjacent a second side of the first semiconductor fin, a first gate stack over and along sidewalls of the first semiconductor fin, the first dielectric fin, and the second dielectric fin, a first epitaxial source/drain region in the first semiconductor fin and extending from the first dielectric fin to the second dielectric fin, and an air gap between the first epitaxial source/drain region and the substrate, the air gap extending between the first dielectric fin and the second dielectric fin.

20 Claims, 36 Drawing Sheets

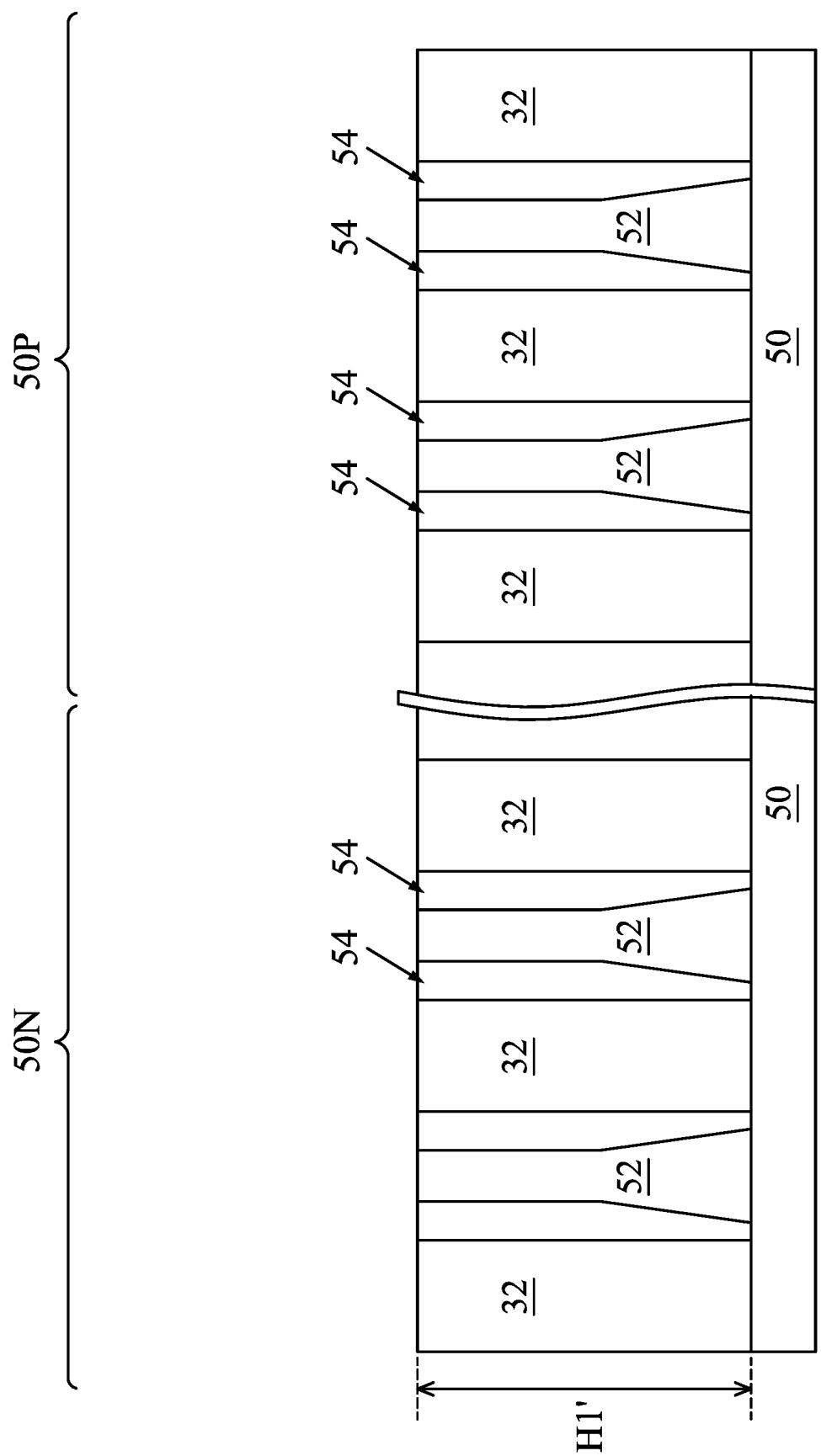

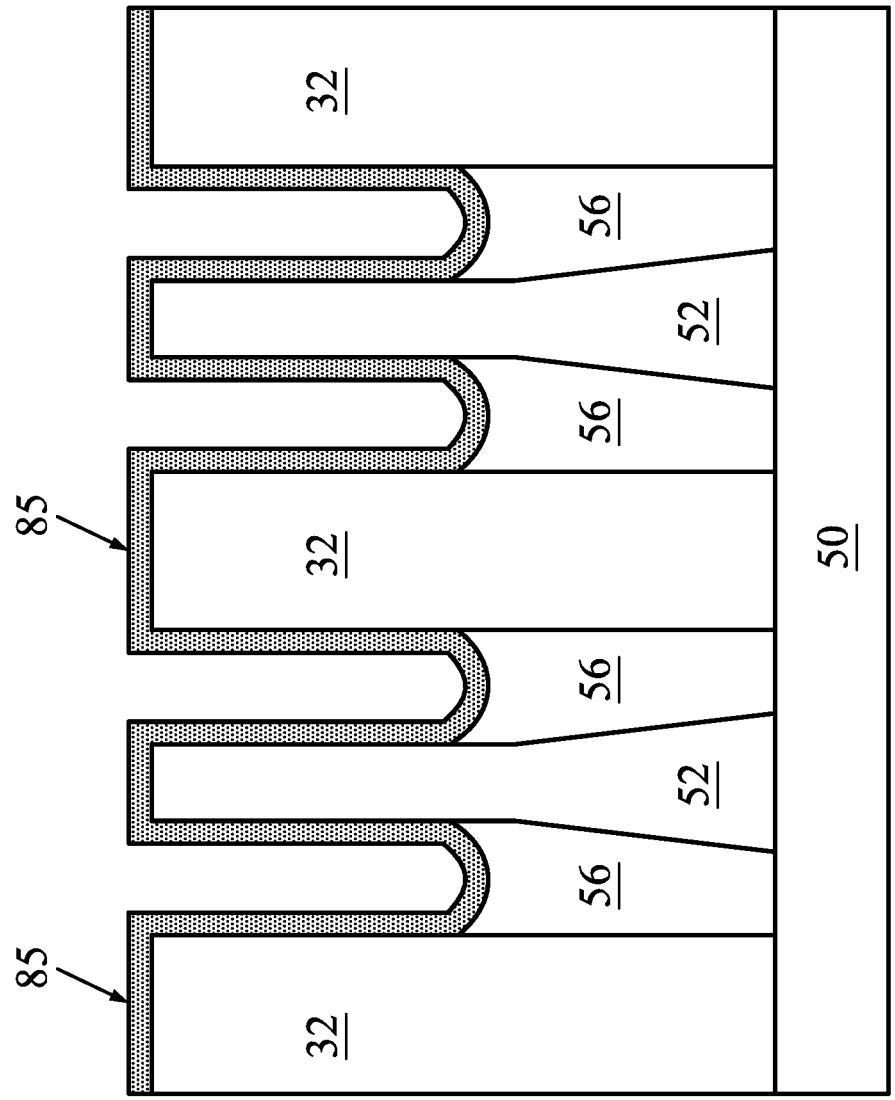

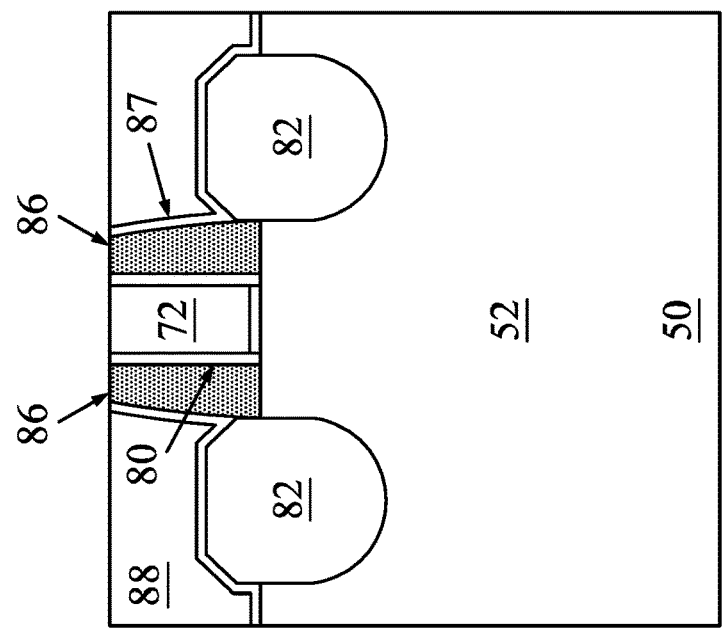
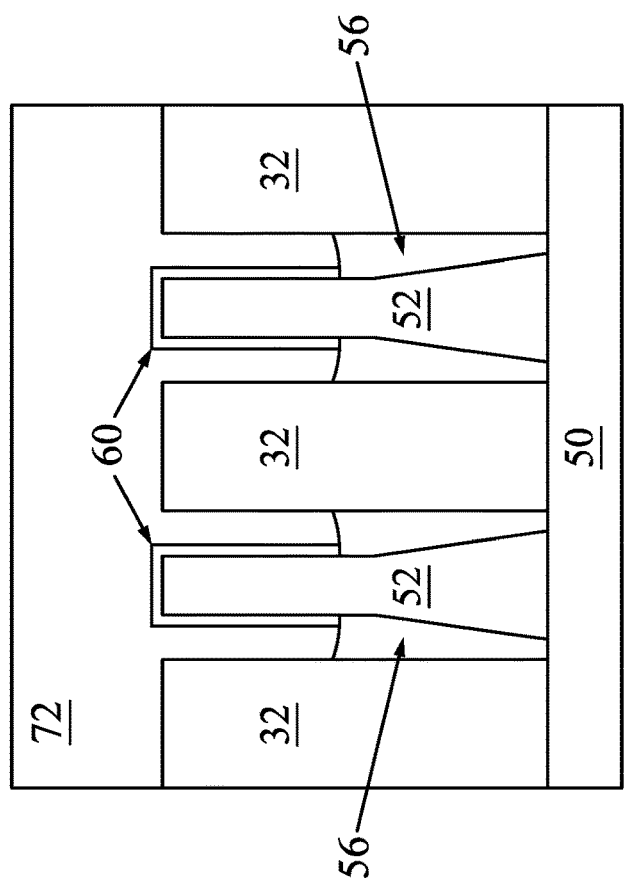
Figure 17B
Figure 17A

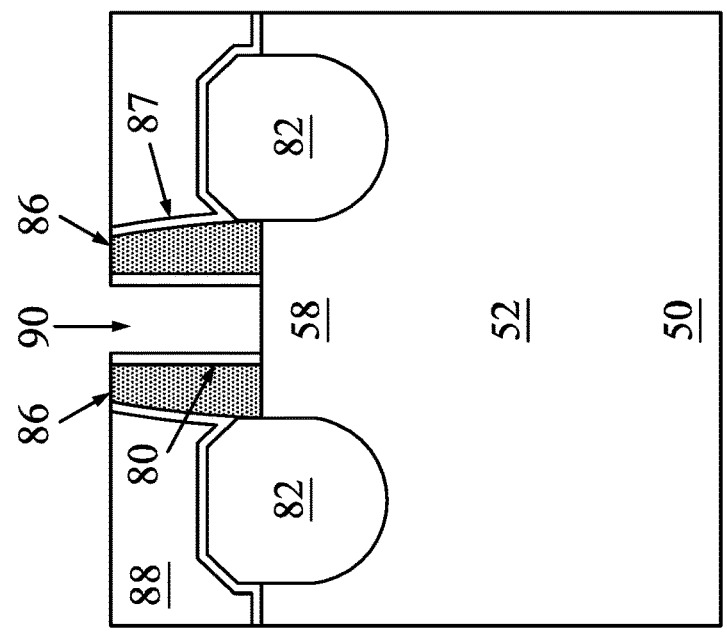
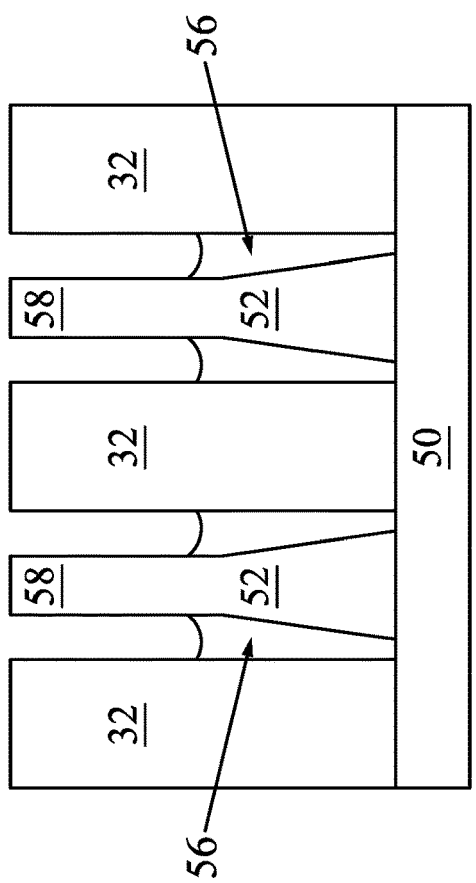
Figure 18B
Figure 18A

US 10,879,128 B2

1

SEMICONDUCTOR DEVICE AND METHOD OF FORMING SAME

PRIORITY CLAIM AND CROSS-REFERENCE

This patent application claims priority to U.S. Provisional Application No. 62/726,151, filed on Aug. 31, 2018 and entitled "Semiconductor Device and Method," which application is hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4, 5, 6, 7, 8A, 8B, 9A, and 9B are cross-sectional views of intermediate stages in the manufacturing of dielectric fins of a FinFET device, in accordance with some embodiments.

FIGS. 10, 11A, 11B, 11C, 12A, 12B, 12C, 13A, 13B, 13C, 14A, 14B, and 14C are cross-sectional views of intermediate stages in the manufacturing of a FinFET device, in accordance with some embodiments.

FIGS. 16A, 16B, 16C, 17A, 17B, 17C, 18A, 18B, 19A, 19B, 19C, 20A, 20B, 20C, 21A, 21B, 21C, 22A, 22B, and 22C are cross-sectional views of intermediate stages in the manufacturing of a FinFET device, in accordance with some embodiments.

DETAILED DESCRIPTION

Figure 1:
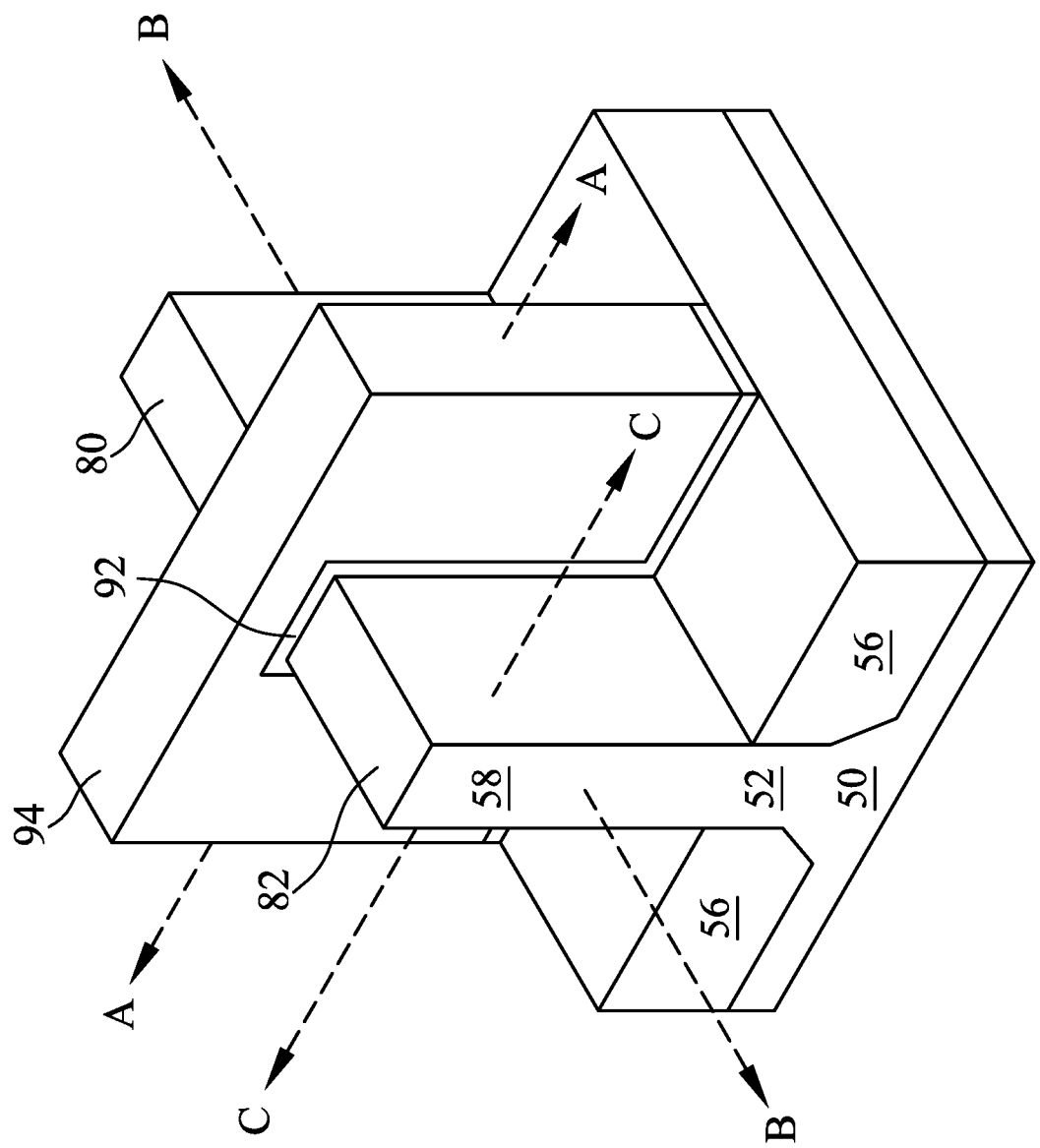
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments are described in detail with respect to a specific context, namely, a FinFET device and a method of forming the same. Embodiments describe dielectric fins that allow air gaps to be formed that partially isolate epitaxial source/drain regions. The use of air gaps to isolate epitaxial source/drain regions can reduce the parasitic capacitance of the FinFET device, which can improve device performance, particularly at higher frequency operation. One of skill will recognize, however, that these techniques which are described in detail with respect to a FinFET device may also be applied to other contexts as also described below.

The discussion of embodiments in the context of FinFETs is not intended to limit the application of these techniques in any way. The discussed formation of the FinFET, including the source/drain regions, gate structure, and channel regions of the FinFET are presented as an example. These processes may be altered while staying within the intended scope of the embodiments discussed herein.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94.

FIG. 1 further illustrates reference cross-sections that are used in later figures. Cross-section A-A is along a longitudinal axis of the gate electrode 94 and in a direction, for example perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 22C are cross-sectional views of intermediate stages in the manufacturing of FinFETs, in accordance with some embodiments. FIGS. 2 through 10 illustrate reference cross-section A-A illustrated in FIG. 1, except for multiple fins/FinFETs. In FIGS. 11A through 19B and 20A through 22C, figures ending with an "A" designation are illustrated along reference cross-section A-A illustrated in FIG. 1, figures ending with a "B" designation are illustrated along a similar cross-section B-B illustrated in FIG. 1, and figures ending with a "C" designation are illustrated along a similar cross-section C-C illustrated in FIG. 1, except for multiple fins/FinFETs.

Figure 2:
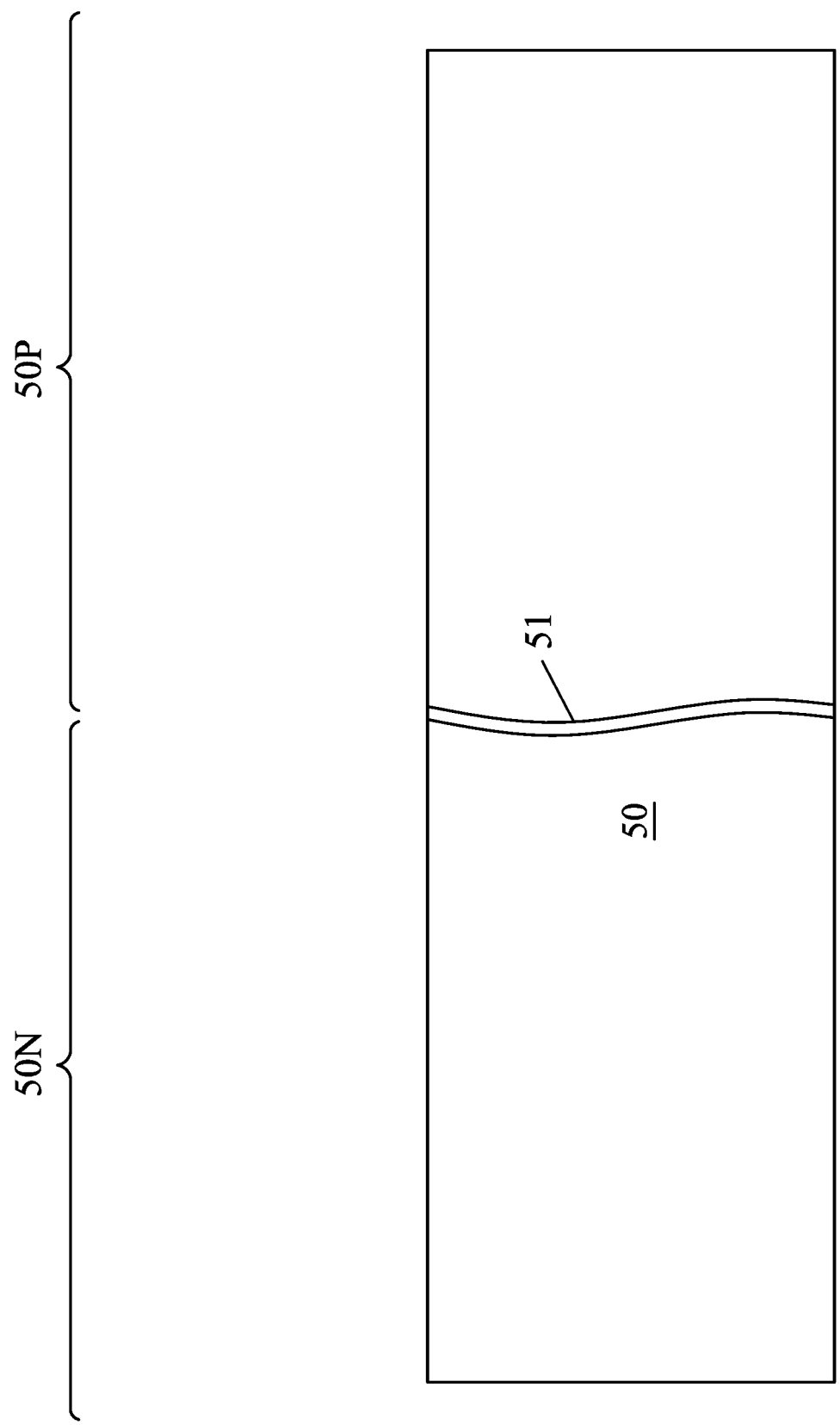
FIGS. 2 and 3 are cross-sectional views of intermediate stages in the manufacturing of semiconductor fins of a FinFET device, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P. In some embodiments, both the region 50N and the region 50P are used to form the same type of devices, such as both regions being for n-type devices or p-type devices.

Figure 3:
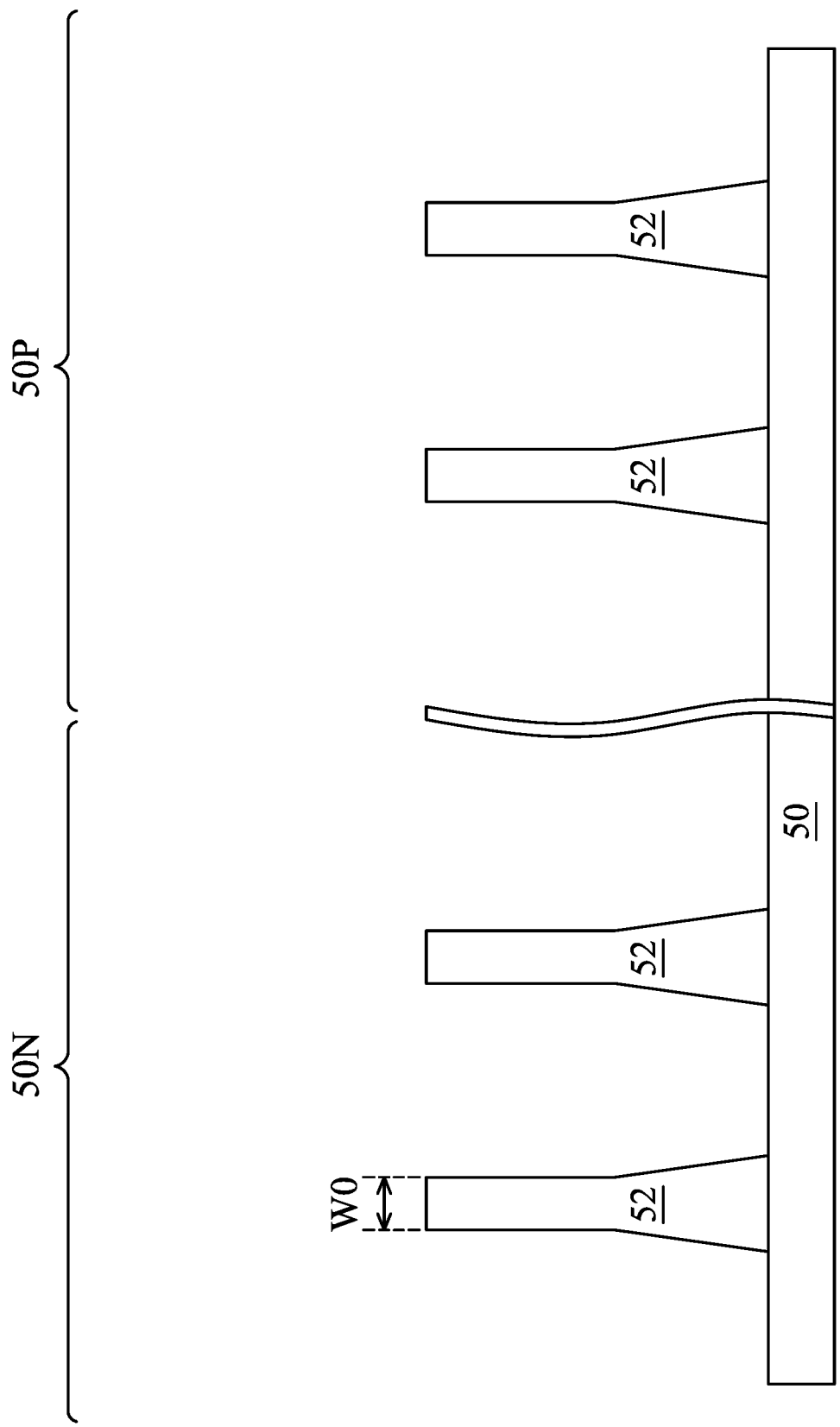

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins 52 may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 52.

Figure 4:
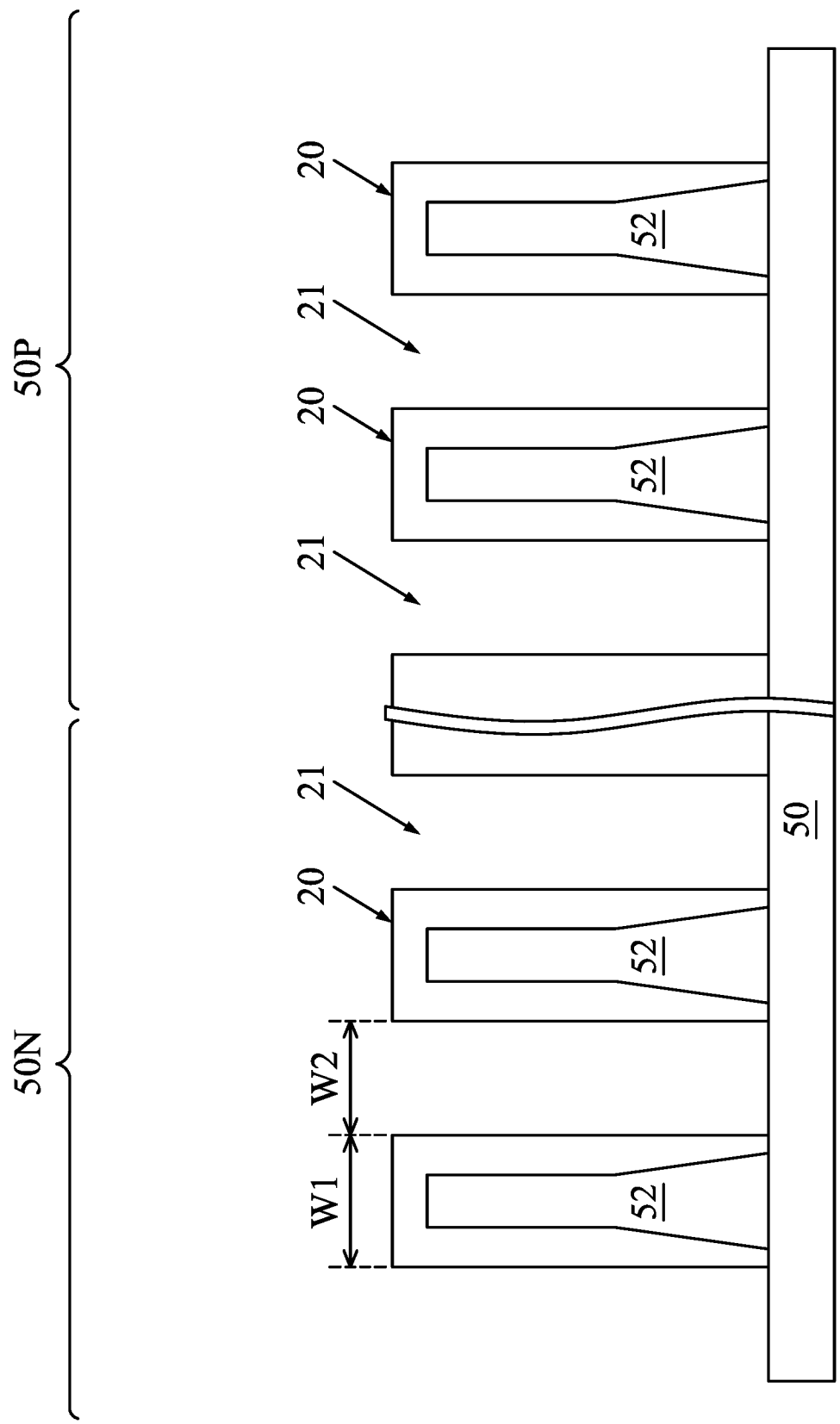

Turning to FIG. 4, a mask 20 is formed over the substrate 50 and over the fins 52. The mask 20 may be formed by forming a photoresist structure (not shown) over the substrate 50 and fins 52, and then patterning the photoresist structure using suitable photolithography and etching techniques. The remaining portions of the patterned photoresist structure form the mask 20, and thus the remaining material of the patterned photoresist structure comprises the material of the mask 20. The patterning may form openings 21 such that some portions of the mask 20 material remain over the top surfaces and sidewalls of fins 52, and mask 20 material may also remain on surfaces of the substrate 50 adjacent the fins 52. The photoresist structure may include a single layer or may be a multi-layer structure (e.g., a bi-layer structure, a tri-layer structure, or having more than three layers). For example, the photoresist structure (and thus also the mask 20 material) may include materials such as photoresist materials, oxide materials, nitride materials, other dielectric materials, the like, or a combination thereof. In some embodiments, the photoresist structure includes a bottom anti-reflective coating (BARC). The layer or layers of the photoresist structure may be formed using one or more suitable techniques, such as spin-on techniques, CVD, PE-CVD, ALD, PVD, sputtering, the like, or a combination. The photoresist structure may be etched using one or more wet etching processes or anisotropic dry etching processes. In some embodiments, a double-patterning or multi-patterning process may be used to form the mask 20. Though not illustrated in FIG. 4, the mask 20 may be patterned such that the mask 20 material covers portions of the substrate 50 that are separate from a fin 52, or may be patterned such that the mask 20 material extends fully between at least portions of some adjacent fins 52 and no openings 21 are present between these portions of the adjacent fins 52. In some embodiments, the mask 20 may be patterned such that portions of one or more fins 52 are free of the mask 20 material (not shown). In some embodiments, a portion of the mask 20 covering a fin 52 may have a width W1 that is between about 30 nm and about 100 nm. In some embodiments, the openings 21 between fins 52 may have a width W2 that is between about 5 nm and about 30 nm. In some embodiments, a portion of the mask 20 covering a fin 52 may extend farther from one side of the fin 52 than from the opposite side of the fin 52.

Figure 5:
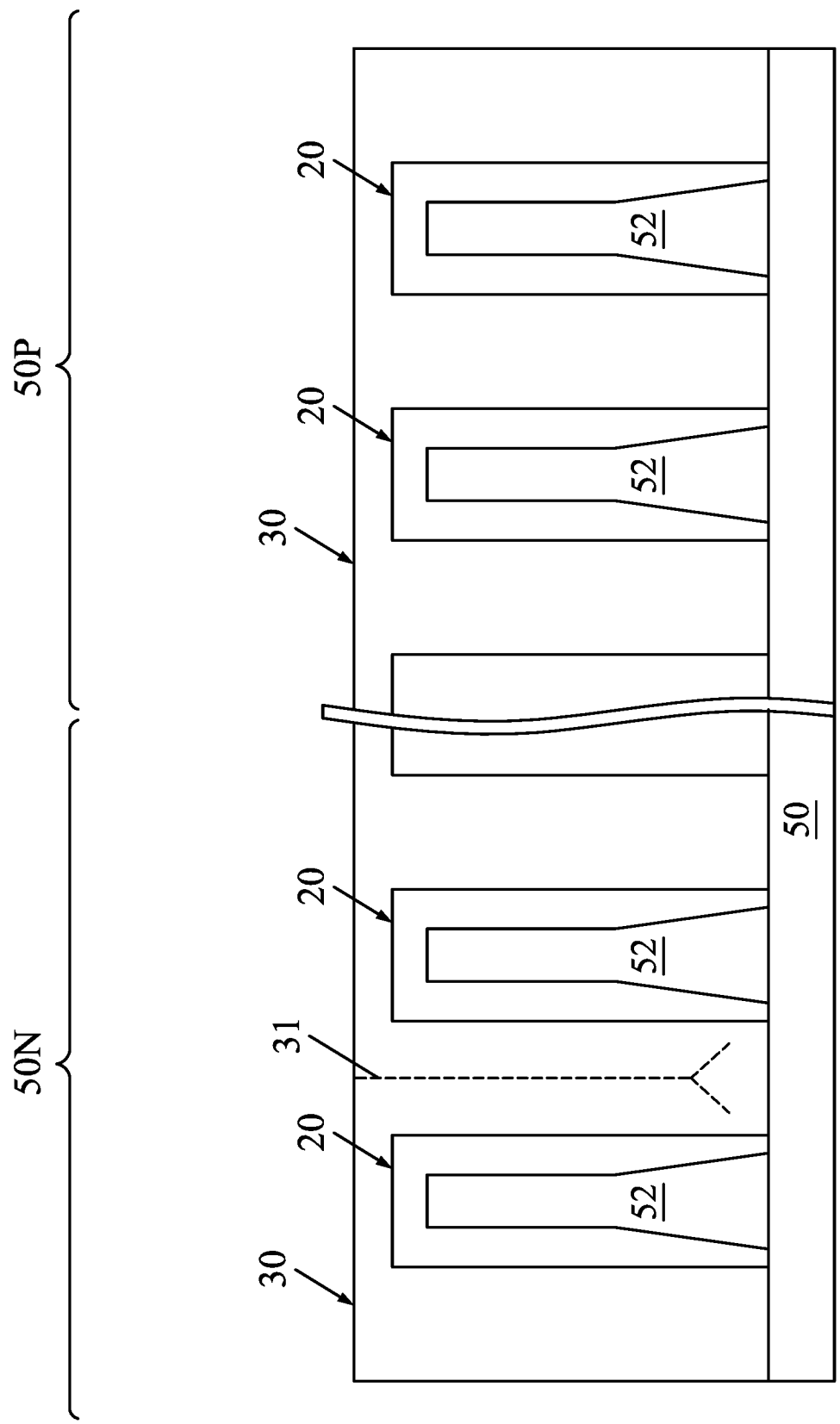

In FIG. 5, a dielectric material 30 is formed over the substrate 50 and over the mask 20. The dielectric material 30 fills the openings 21 and may extend over the mask 20, as shown in FIG. 5. The dielectric material 30 may include one or more layers of materials such as a nitride (e.g., silicon nitride, a metal nitride, etc.), an oxide (e.g., silicon oxide, aluminum oxide, hafnium oxide, zirconium oxide, etc.), silicon oxynitride, silicon oxycarbonitride, silicon oxycarbide, another dielectric material, the like, or a combination thereof. The dielectric material 30 may be formed using one or more suitable techniques, such as spin-on techniques, CVD, PE-CVD, ALD, PVD, sputtering, the like, or a combination. In some embodiments, the dielectric material 30 is formed using a conformal deposition process. In some cases, the use of a conformal deposition process to form the dielectric material 30 may form one or more seams in the dielectric material 30. An example seam 31 is shown in FIG. 5 for illustrative purposes.

Figure 6:
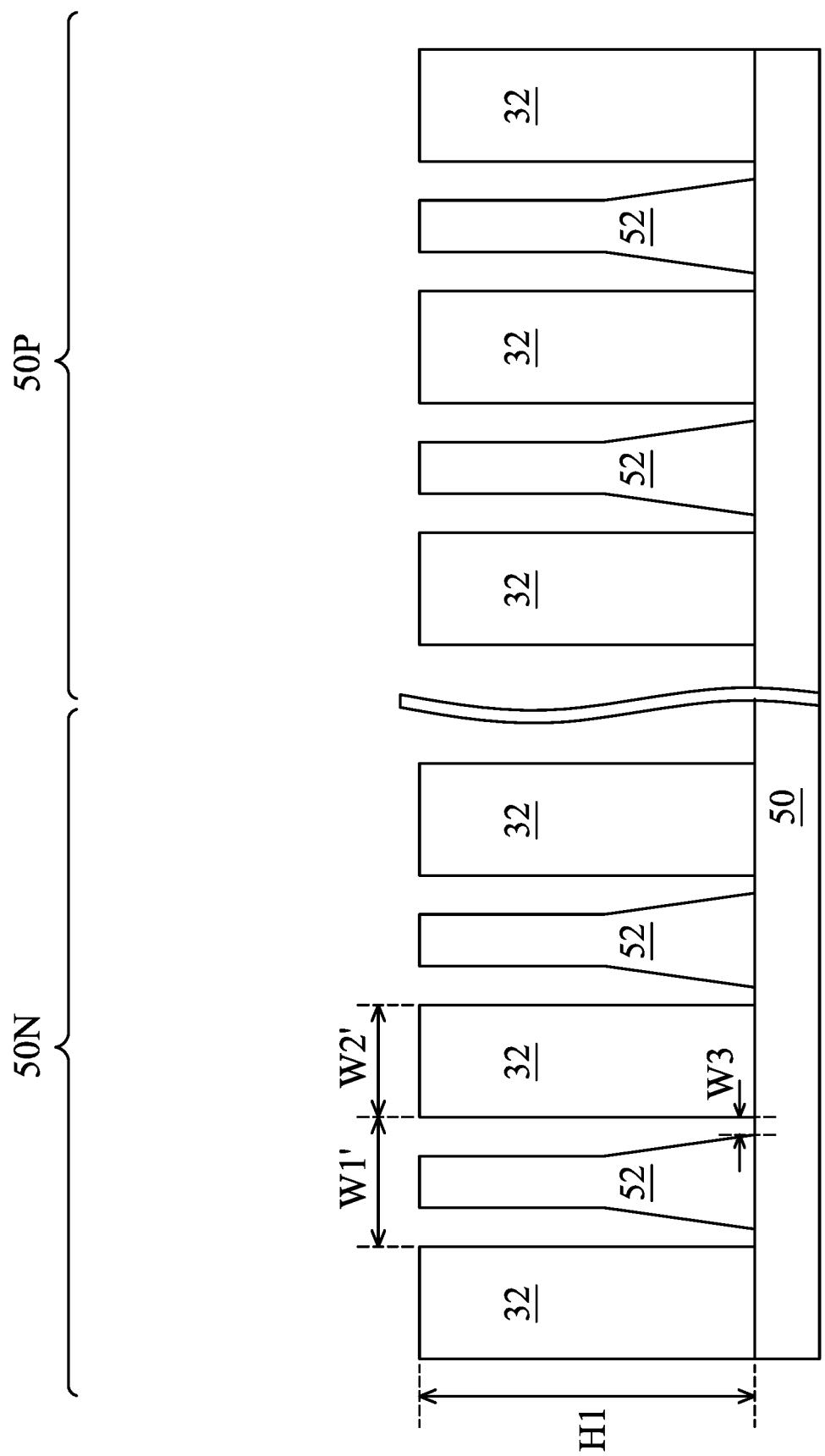

In FIG. 6, the mask 20 is removed, forming dielectric fins 32 from the dielectric material 30. In this manner, the mask 20 may also be considered a sacrificial layer. The dielectric fins 32 may be disposed adjacent one side or adjacent opposite sides of a fin 52 and/or between adjacent fins 52. The dielectric fins 32 may extend parallel to lengthwise direction of the fins 52, and may be strips. In some embodiments, upper portions of the dielectric material 30 are first removed to expose the mask 20. In some embodiments, a planarization process such as a CMP process may be performed to remove upper portions of the dielectric material 30 prior to removal of the mask 20. In some embodiments, upper portions of the dielectric material 30 may be removed in an etching process (e.g., a wet and/or dry etching process) that is performed separate from removal of the mask 20. The etching process may be selective to the dielectric material 30 over the material of the mask 20. The mask 20 may be removed using one or more suitable processes, such as using a wet process or a dry process (e.g., an ashing process). After removal of the mask 20, the dielectric fins 32 may have a height above the substrate 50 about the same or greater than the fins 52.

In other embodiments, the dielectric fins 32 may be formed using a different technique. For example, in some embodiments, the dielectric fins 32 may be formed by depositing a blanket layer of dielectric material 30 over the substrate 50. A mask may then be formed over the layer of dielectric material 30 and patterned. For example, the mask may be a photoresist or photoresist structure that is patterned using a suitable photolithography and etching process. The dielectric material 30 may then be etched (e.g., using an anisotropic dry etching process) using the patterned mask as an etching mask. The remaining portions of the dielectric material 30 form the dielectric fins 32. The patterned mask may be removed using a suitable process (e.g., an ashing or etching process). These and other techniques for forming the dielectric fins 32 are contemplated in this disclosure.

Still referring to FIG. 6, the dielectric fins 32 may have a height H1 above the substrate 50 that is between about 100 nm and about 300 nm. In some embodiments, the dielectric fins 32 may have a width W2' that is between about 5 nm and about 30 nm. In some cases, the width W2' may be about the same as the width W2 (see FIG. 4). In some embodiments, the separation between dielectric fins 32 on opposite sides of a fin 52 may be a width W1' between about 30 nm and about 100 nm. By controlling the width W1' between the dielectric fins 32, the size of the epitaxial source/drain regions 82 or air gap 100 may be controlled (see FIGS. 15A-D). In some cases, the width W1' may be about the same as the width W1 (see FIG. 4). The bottom of a dielectric fin 32 may be separated from the bottom of a fin 52 by a width W3 between about 5 nm and about 30 nm. A width W3 for a first dielectric fin 32 on one side of a fin 52 may be different than a width W3 for a second dielectric fin 32 on the opposite side of the fin 52. In some embodiments, the dielectric fins 32 may have straight sidewalls, which may be about perpendicular to the top surface of the substrate 50 or at an angle oblique to the top surface of the substrate 50. In some embodiments, the dielectric fins 32 may have sidewalls with an angled, curved, or irregular profile. The dielectric fins 32 may have a substantially constant width (e.g., width W2') or may have a tapered profile, concave profile, convex profile, or other profile having multiple widths.

Figure 7:
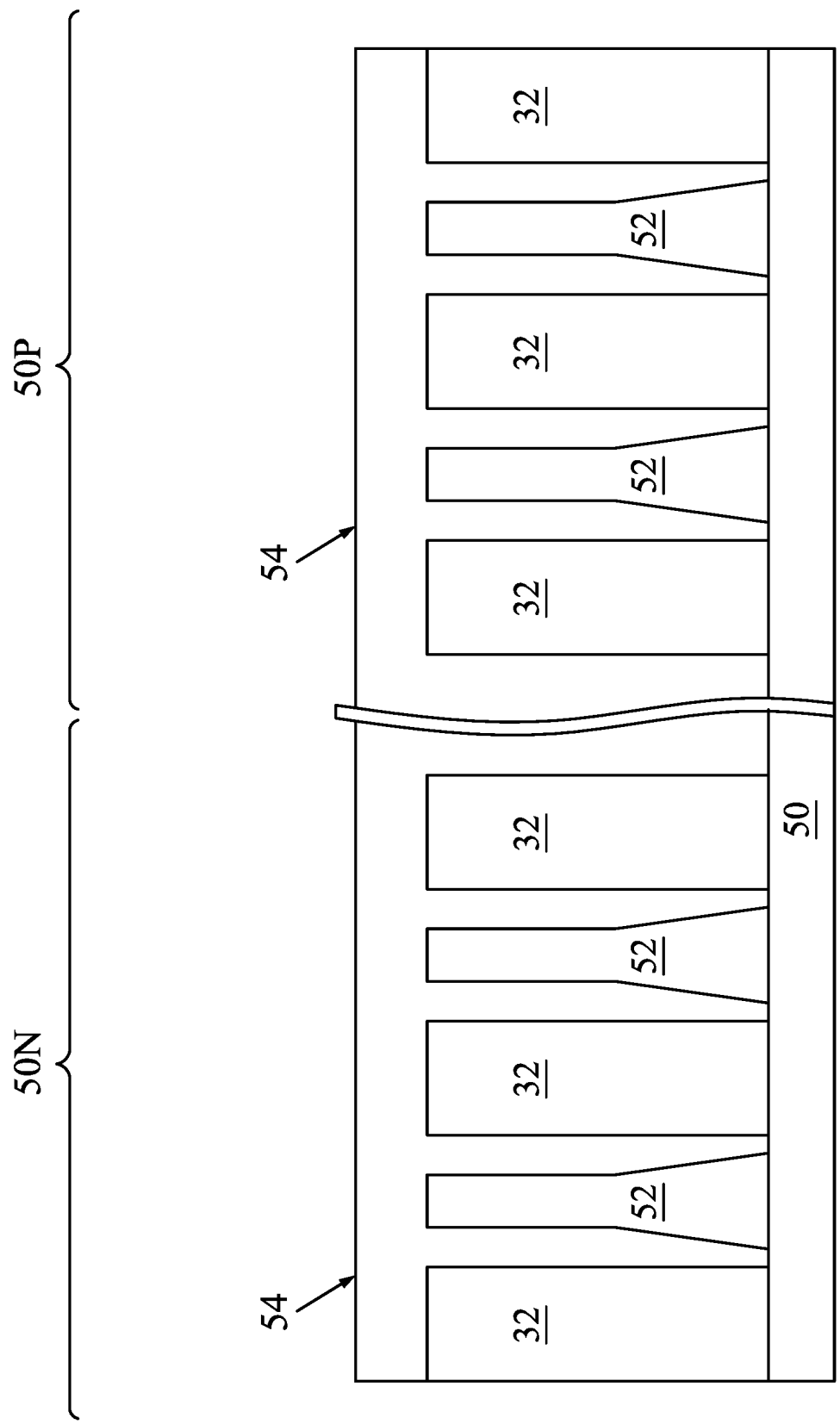

In FIG. 7, an insulation material 54 is formed over the substrate 50 and between neighboring fins 52 or dielectric fins 32. The insulation material 54 may be a material different from that of the fins 52 or the dielectric fins 32, and may be a material such as an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. The material of the insulation material 54 may be chosen such that the insulation material 54 may be selectively etched over the material of the fins 52 or the material of the dielectric fins 32. An anneal process may be performed once the insulation material 54 is formed. In an embodiment, the insulation material 54 is formed such that excess insulation material 54 covers the fins 52 and dielectric fins 32, as shown in FIG. 87. Although the insulation material 54 is illustrated as a single layer, some embodiments may utilize multiple layers. For example, in some embodiments, a liner (not shown) may first be formed along a surface of the substrate 50, the fins 52, and the dielectric fins 32. Thereafter, a material such as those discussed above may be formed over the liner.

Figure 8B:
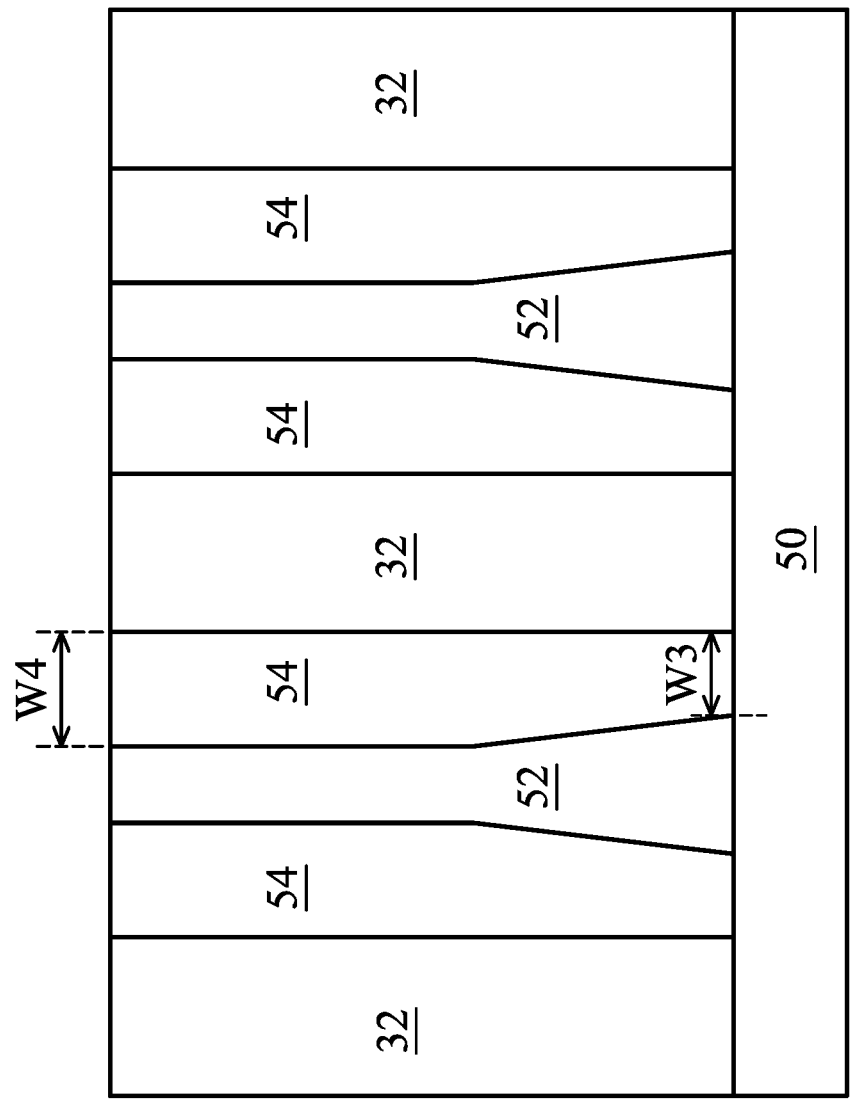

In FIGS. 8A-B, a removal process is applied to the insulation material 54 to remove excess insulation material 54 over the fins 52. For clarity, FIG. 8B illustrates a representative close-up view of a portion of the structure shown in FIG. 8A, which may be in either region 50N or in region 50P. In some embodiments, a planarization process such as a chemical mechanical polish (CMP), an etch back process, combinations thereof, or the like may be utilized. In some embodiments, portions of the dielectric fins 32 may also be removed by the planarization process. The planarization process may expose the fins 52 such that top surfaces of the fins 52, the dielectric fins, and the insulation material 54 are level after the planarization process is complete, as shown in FIGS. 8A-B. In this manner, the dielectric fins 32 may be separated from the fins 52 by the insulation material 54. In some embodiments, the dielectric fins 32 may have a height H1' between about 100 nm and about 300 nm. In some cases, the height H1' may be about the same as the height H1 (see FIG. 4). The top of a dielectric fin 32 may be separated from the top of a fin 52 by a width W4 between about 5 nm and about 30 nm. A width W4 for a first dielectric fin 32 on one side of a fin 52 may be different than a width W4 for a second dielectric fin 32 on the opposite side of the fin 52.

Figure 9A:
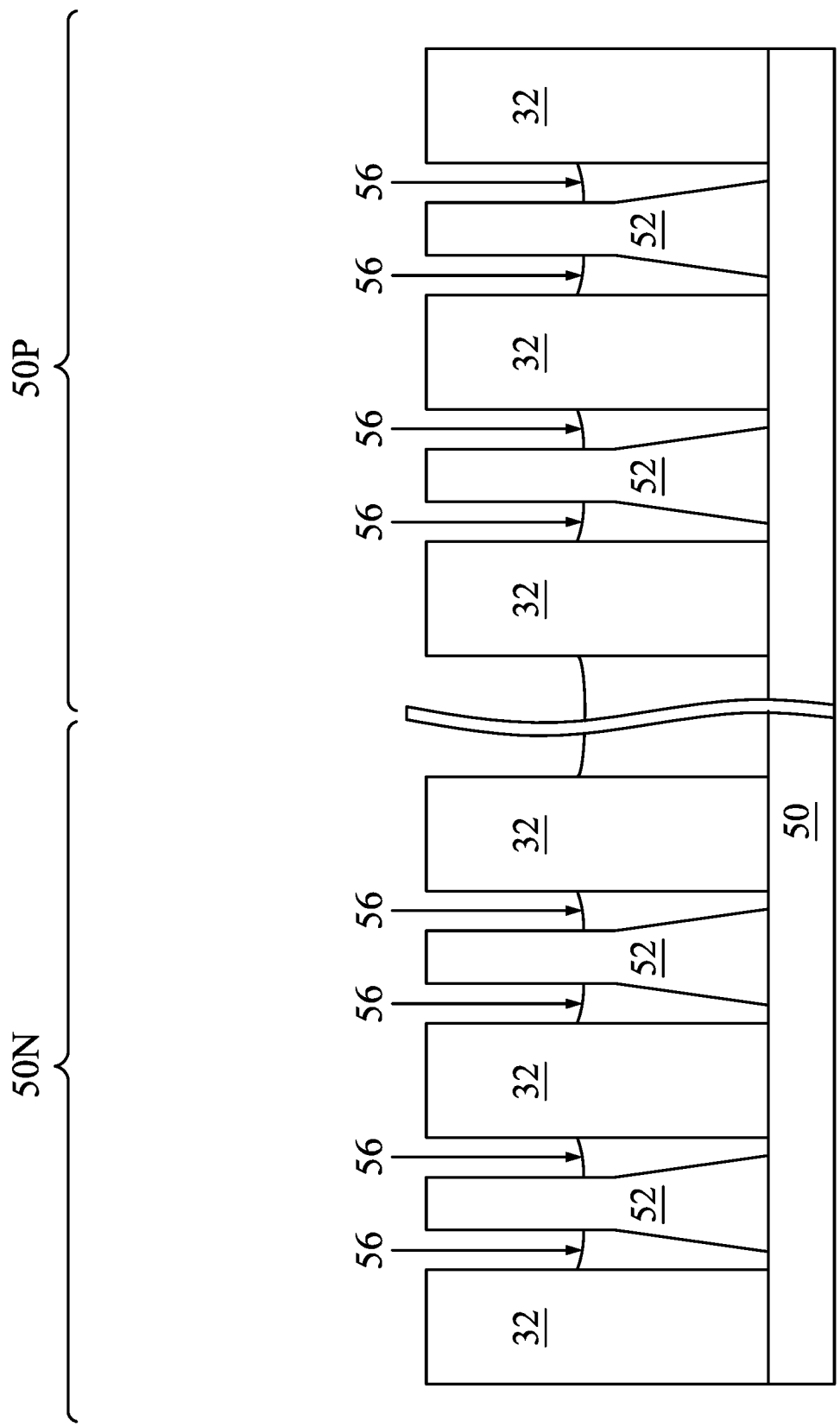
Figure 9B:
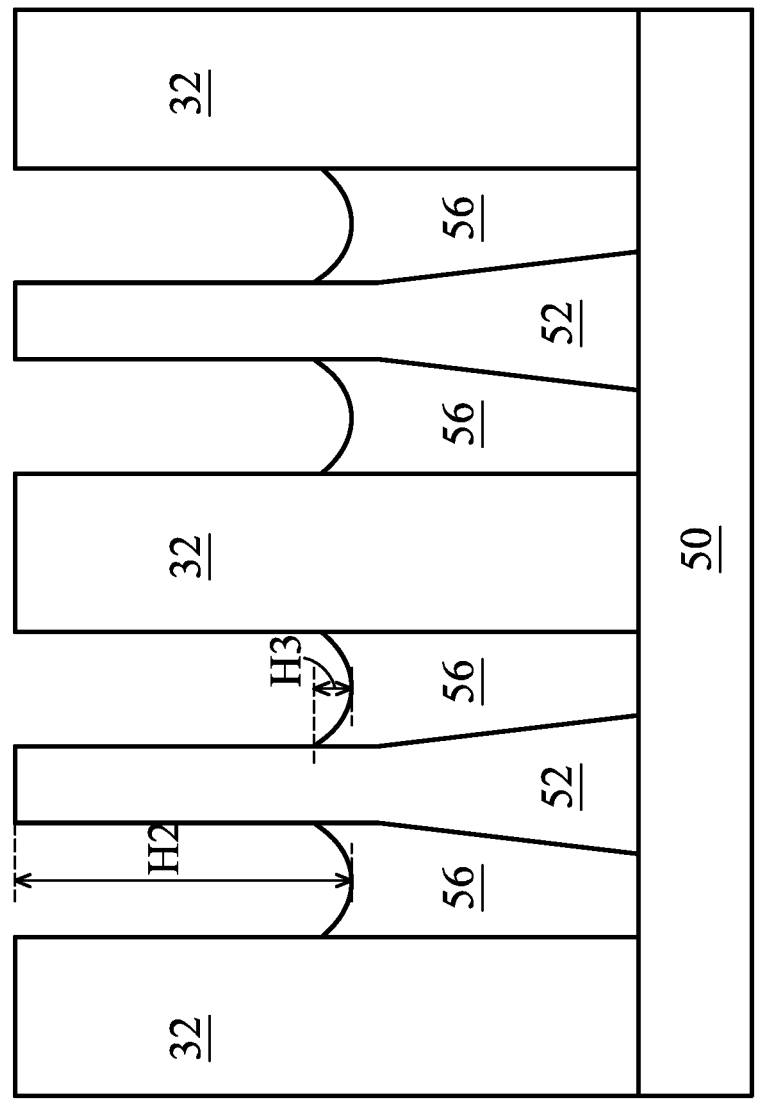

In FIGS. 9A-B, the insulation material 54 is recessed to form Shallow Trench Isolation (STI) regions 56. For clarity, FIG. 9B illustrates a representative close-up view of a portion of the structure shown in FIG. 9A, which may be in either region 50N or in region 50P. The insulation material 54 is recessed such that upper portions of fins 52 in the region 50N and in the region 50P protrude from between neighboring STI regions 56. Further, the top surfaces of the STI regions 56 may have a concave (dished) surface as illustrated in FIGS. 9A-B, a convex surface, a flat surface, or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the materials of the fins 52 or the dielectric fins 32). For example, a chemical oxide removal with a suitable etch process using, for example, dilute hydrofluoric (dHF) acid may be used. In other embodiments, a dry etching process may be used to recess the insulation material 54. In some embodiments, the insulation material 54 may be etched a depth such that that a top surface of the STI regions 56 is a distance H2 that is between about 20 nm and about 70 nm. In some embodiments, the top surface of an STI region 56 between a fin 52 and a dielectric fin 32 may have a concave shape, in which portions the STI region 56 that are adjacent to the fin 52 and/or adjacent to the dielectric fin 32 may be higher (i.e., farther from a top surface of the substrate 50) than other portions of the STI region 56. A portion of an STI region 56 adjacent to a fin 52 may be higher, lower, or about the same height as a portion of the STI region 56 adjacent to a dielectric fin 32. In some embodiments, a vertical difference between the highest surface of a STI region 56 and the lowest surface of the STI region 56 is a distance H3 that is between about 3 nm and about 20 nm.

The process described with respect to FIGS. 2 through 9B is just one example of how the fins 52 may be formed. In some embodiments, the fins may be formed by an epitaxial growth process. In some embodiments, heteroepitaxial structures can be used for the fins 52. For example, the fins 52 in FIG. 8A can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown. The epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIGS. 2-9B, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, BF$_2$, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 10:
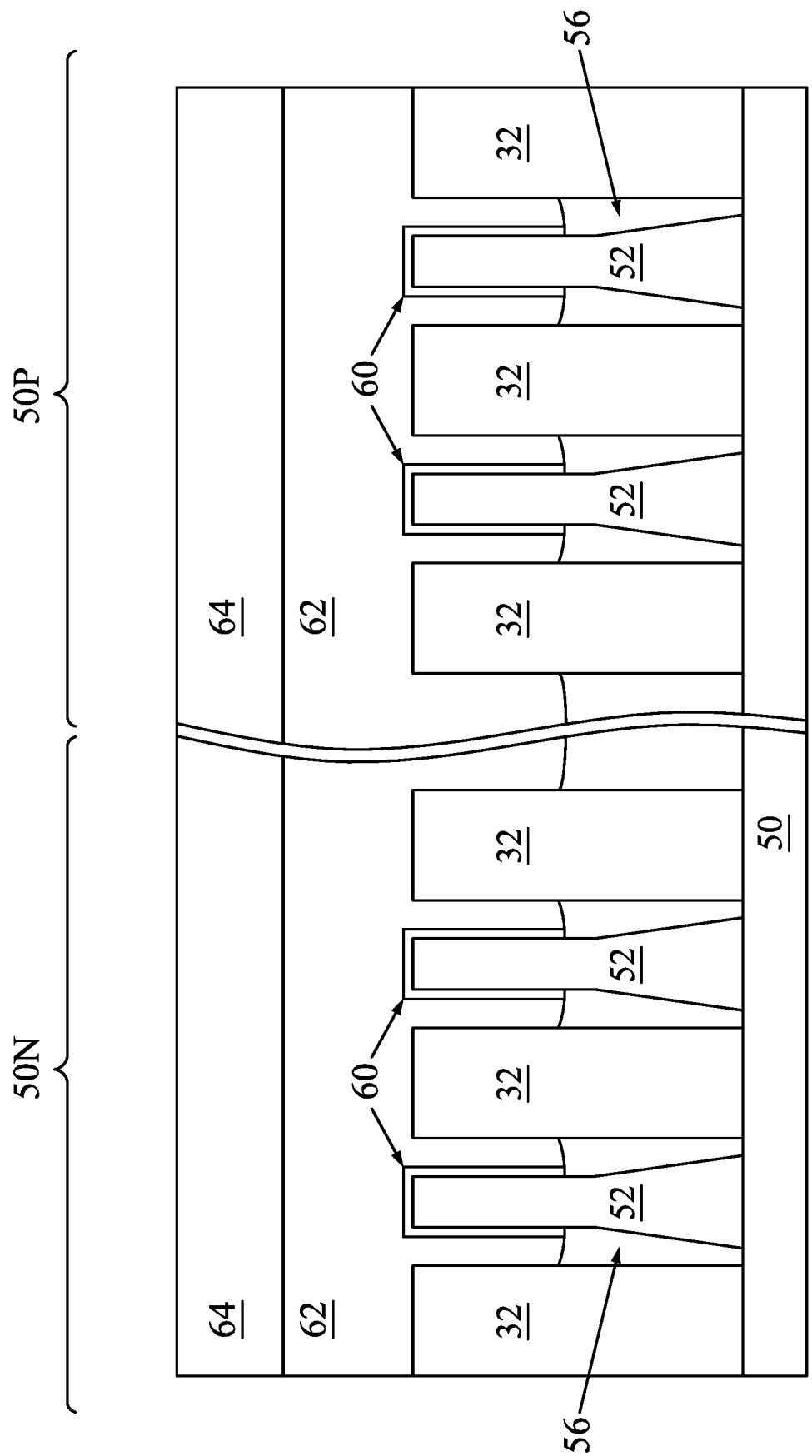

In FIG. 10, a dummy dielectric layer 60 is formed on the fins 52 and the dielectric fins 32, in accordance with some embodiments. The dummy dielectric layer 60 may be, for example, silicon oxide, silicon nitride, a combination thereof, or the like, and may be deposited or thermally grown according to acceptable techniques. FIG. 10 shows a dummy dielectric layer 60 that has been thermally grown. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including amorphous silicon, polycrystalline-silicon (poly-silicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. In some embodiments, separate dummy gate layers may be formed in the region 50N and the region 50P, and separate mask layers may be formed in the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56 and/or the dielectric fins 32.

FIGS. 11A through 22C illustrate various additional steps in the manufacturing of embodiment devices. FIGS. 11A through 22C illustrate features in either of the region 50N and the region 50P. For example, the structures illustrated may be applicable to both the region 50N and the region 50P. Differences (if any) in the structures of the region 50N and the region 50P are described in the text accompanying each figure. FIGS. 11A-22A having an ending designation of "A" (e.g., FIG. 11A) are illustrated along reference cross-section A-A illustrated in FIG. 1. FIGS. 11B-22B having an ending designation of "B" (e.g., FIG. 11B) are illustrated along reference cross-section B-B illustrated in FIG. 1. FIGS. 11C, 12C, 13C, 14C, 15C, 15D, 16C, 17C, 20C, 21C, and 22C are illustrated along reference cross-section C-C illustrated in FIG. 1.

Figure 11B:
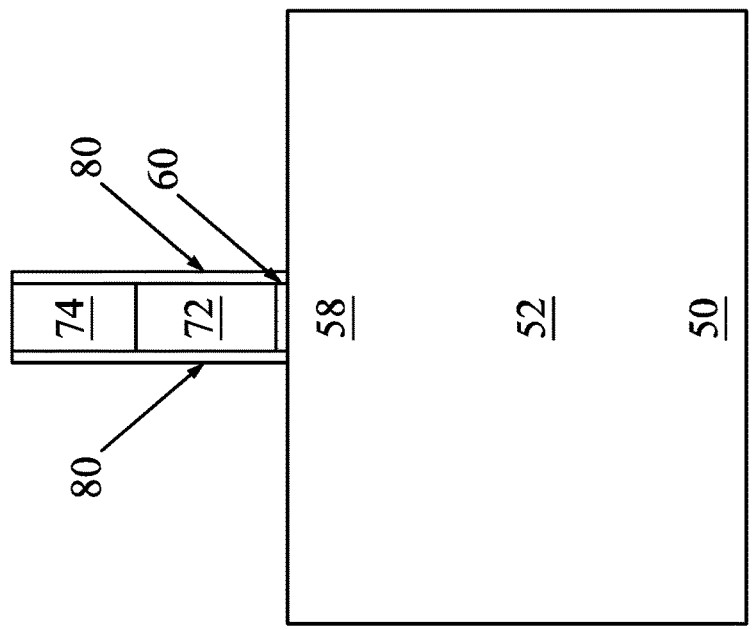
Figure 11A:
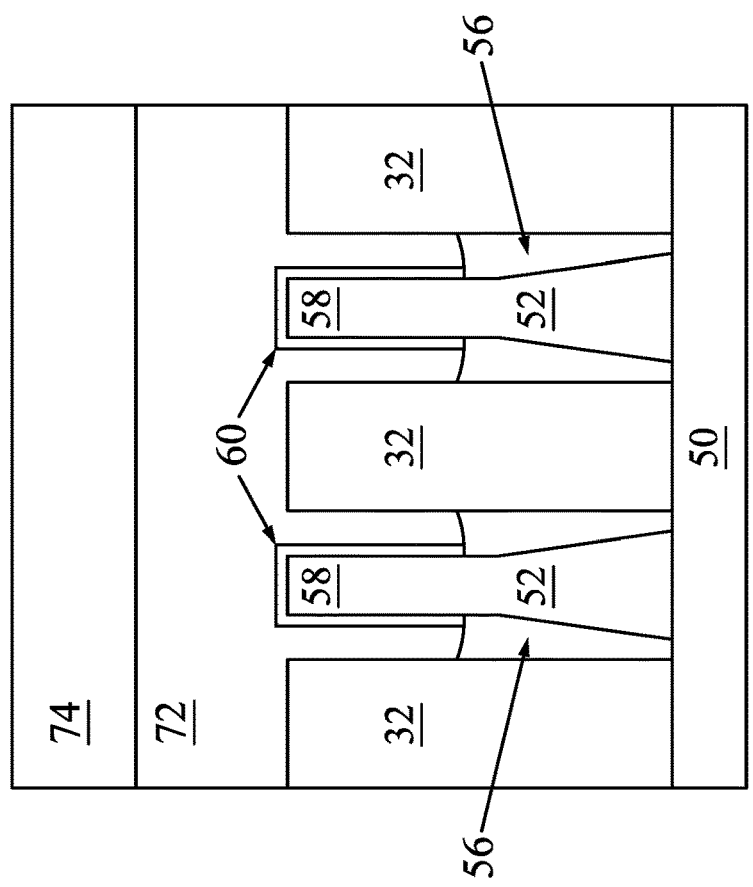
Figure 11C:
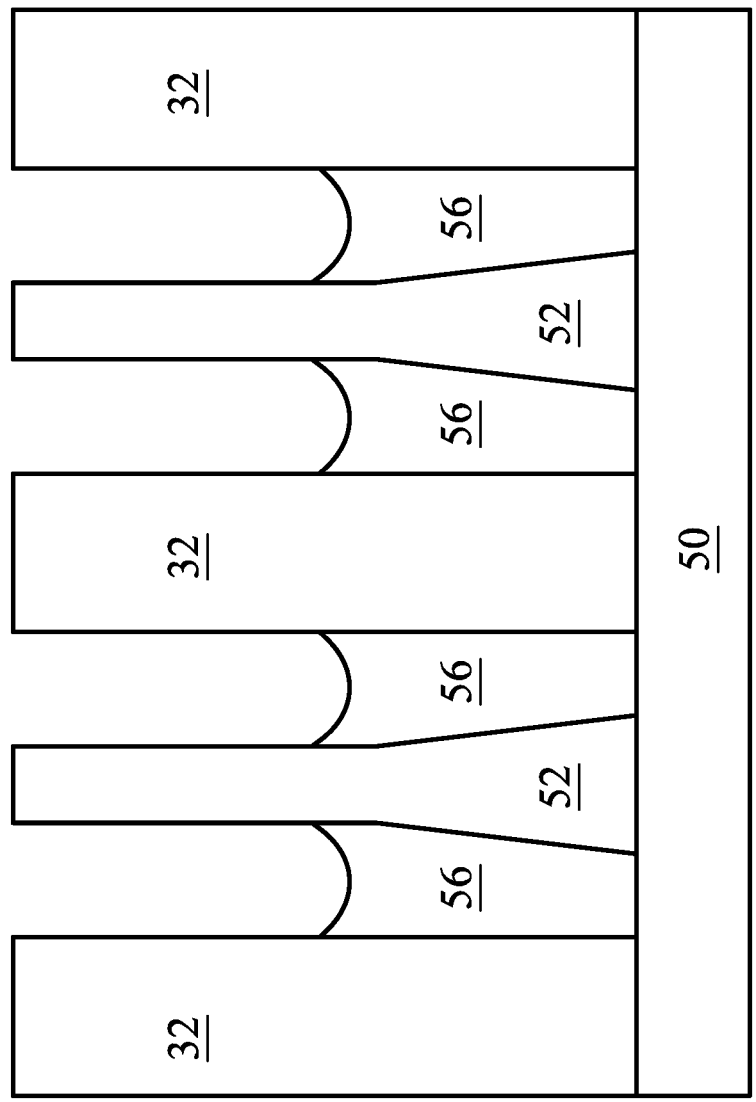

In FIGS. 11A-11C, the mask layer 64 may be patterned using acceptable photolithography and etching techniques to form masks 74. The pattern of the masks 74 then may be transferred to the dummy gate layer 62. In some embodiments, the pattern of the masks 74 may also be transferred to the dummy dielectric layer 60 by an acceptable etching technique, forming dummy gates 72 over remaining portions of the dummy dielectric layer 60. In some embodiments in which the dummy dielectric layer 60 is formed over the STI regions 56 and/or dielectric fins 32, the dummy dielectric layer 60 may or may not be patterned. The dummy gates 72 cover respective channel regions 58 of the fins 52. The pattern of the masks 74 may be used to physically separate each of the dummy gates 72 from adjacent dummy gates 72. The dummy gates 72 may also have a lengthwise direction substantially perpendicular to the lengthwise direction of respective epitaxial fins 52.

Further in FIGS. 11A-C, gate seal spacers 80 can be formed on exposed surfaces of the dummy gates 72, the masks 74, and/or the fins 52. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIGS. 9A-B, a mask, such as a photoresist, may be formed over the region 50N, while exposing the region 50P, and appropriate type (e.g., n-type or p-type) impurities may be implanted into the exposed fins 52 in the region 50P. The mask may then be removed. Subsequently, a mask, such as a photoresist, may be formed over the region 50P while exposing the region 50N, and appropriate type impurities may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 12B:
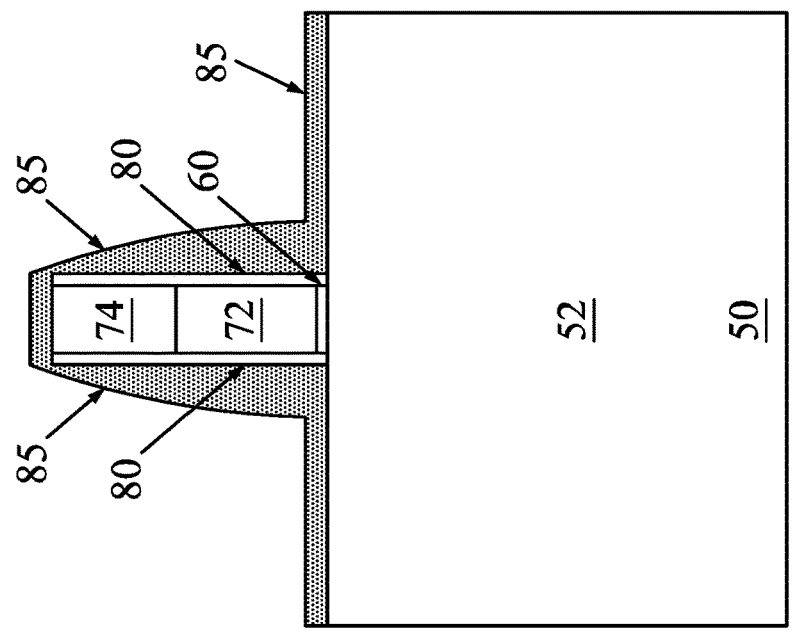
Figure 12A:
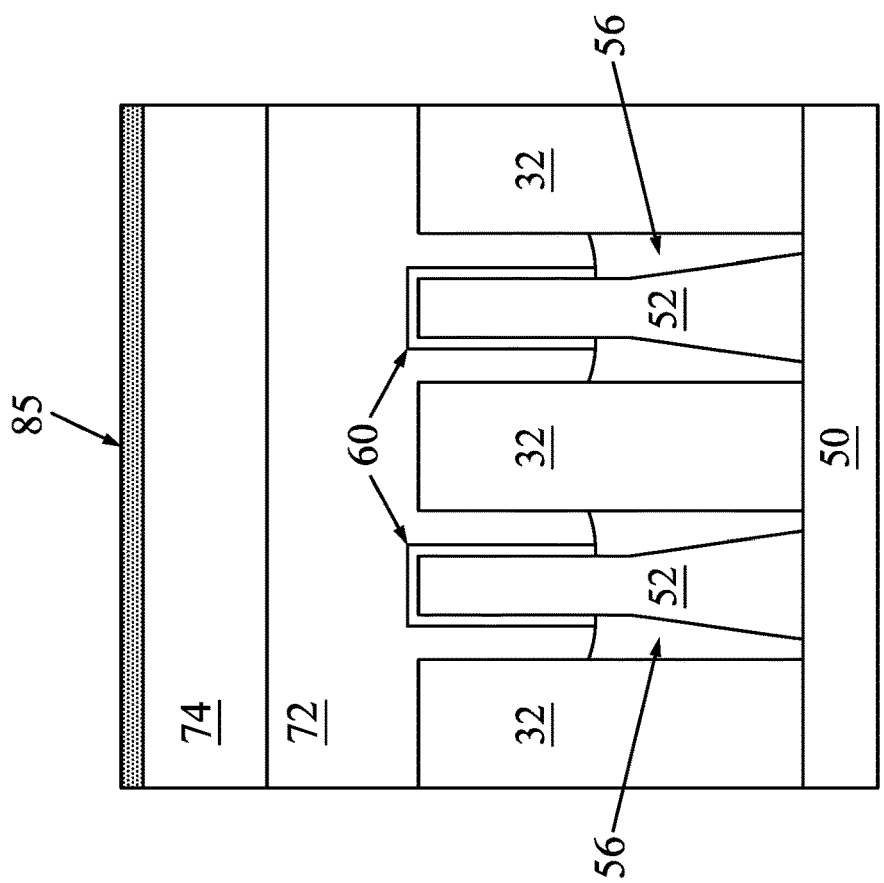

In FIGS. 12A-C, a spacer layer 85 is formed over exposed surfaces, which may include surfaces of the substrate 50, the masks 74, the gate seal spacers 80, the STI regions 56, the fins 52, or the dielectric fins 32. In some embodiments, the spacer layer 85 may comprise one or more layers of materials such a low-k dielectric material, phosphosilicate glass (PSG), borophosphosilicate glass (BPSG), fluorinated silicate glass (FSG), silicon oxide, silicon nitride, silicon oxycarbide, silicon carbide, silicon carbonitride, the like, or a combination. The spacer layer 85 may be formed using any suitable method, such as CVD, PECVD, PVD, ALD, sputtering, the like, or a combination. The spacer layer 85 may be conformally deposited. In some embodiments, the material or composition of the spacer layer 85 may be different than the material or composition of the dielectric fins 32, though the spacer layer 85 and the dielectric fins 32 may comprise the same material in other embodiments. In some embodiments, the spacer layer 85 may be formed having a thickness between about 2 nm and about 20 nm.

Figure 13B:
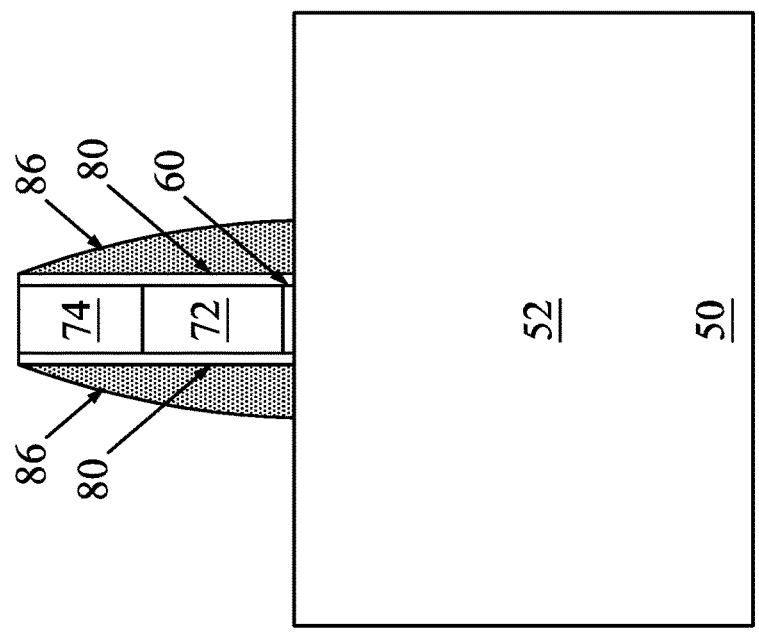
Figure 13A:
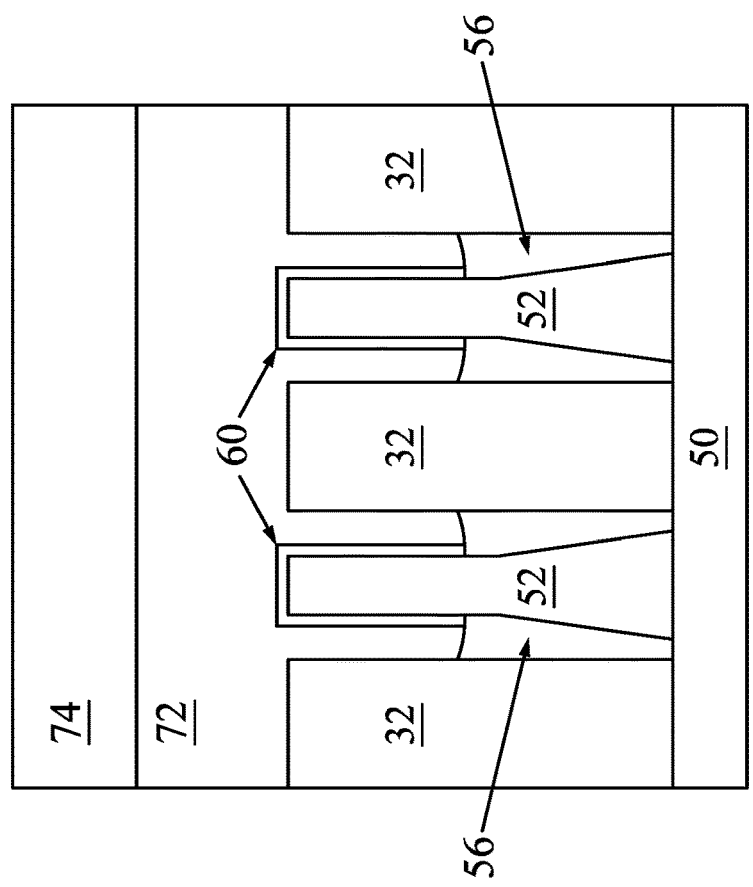
Figure 13C:
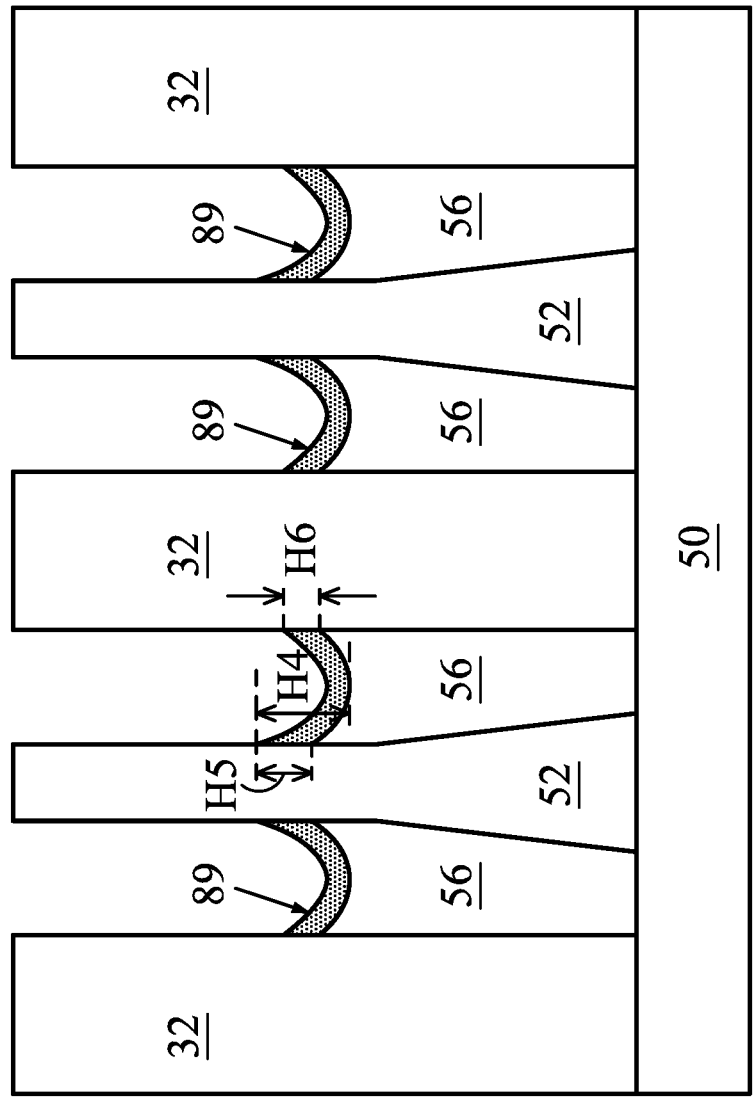

In FIGS. 13A-C, the material of the spacer layer 85 is etched to form gate spacers 86 and spacer regions 89. For example, the spacer layer 85 may be etched such that portions of the spacer layer 85 remaining over sidewalls of the dummy gates 72 and the masks 74 form gate spacers 86 (see FIG. 13B) and that portions of the spacer layer 85 remaining between the fins 52 and dielectric fins 32 form spacer regions 89 (see FIG. 13C). In some cases, by using an anisotropic etching process having a vertical bias, portions of the spacer layer 85 disposed on horizontal surfaces of the fins 52 and masks 74 may be removed before the portions of the spacer layer 85 disposed on the vertical surfaces of the sidewalls of the dummy gates 72 and the masks 74. The vertical bias may be controlled by, for example, controlling the voltage bias of the substrate 50 during a dry etching process. The spacer layer 85 may be etched using and etching process such as an anisotropic dry etching process. In some embodiments, the anisotropic dry etching process may be a plasma etching process including a plasma generated with a power between about 100 Watts and about 2000 Watts. The plasma etching process may be performed at a pressure between about 10 mTorr and about 100 mTorr and at a process temperature between about 20° C. and about 80° C. The plasma etching process may include one or more process gases such as $CF_4$, $CH_2F_2$, $CH_3F$, $CHF_3$, $Cl_2$, $Ar$, $O_2$, another type of process gas, or a combination. In some embodiments, the plasma etching process may be performed for a duration of time between about 30 seconds and about 1000 seconds. In some embodiments, process parameters of the plasma etching process may be controlled to control the characteristics of the gate spacers 86 or spacer regions 89, such as thickness, shape, profile, height, or other characteristics.

In some embodiments, the spacer layer 85 may be etched such that spacer regions 89 are formed on the STI regions 56, as shown in FIG. 13C. The spacer regions 89 may conform to the shape of the STI regions 56, and thus may have a concave shape if formed over an STI region 56 having a concave shape, for example. In some embodiments, the spacer regions 89 may be layers having a thickness between about 3 nm and about 20 nm. In some embodiments, the difference between a topmost surface of a spacer region 89 and a bottommost surface of a spacer region 89 may be a distance H4 that is between about 5 nm and about 30 nm. The spacer regions 89 may extend from the fin 52 to the dielectric fin 32 or extend partially between the fin 52 and the dielectric fin 32. In some embodiments, a portion of the spacer region 89 disposed on a fin 52 may extend a vertical distance H5 along the fin 52 that is between about 5 nm and about 30 nm. In some embodiments, a portion of the spacer region 89 disposed on a dielectric fin 32 may extend a vertical distance H6 along the dielectric fin 32 that is between about 2 nm and about 30 nm. The portion of a spacer region 89 disposed on a fin 52 may be higher, lower, or have about the same height as the portion of the spacer region 89 disposed on a dielectric fin 32.

Figure 14B:
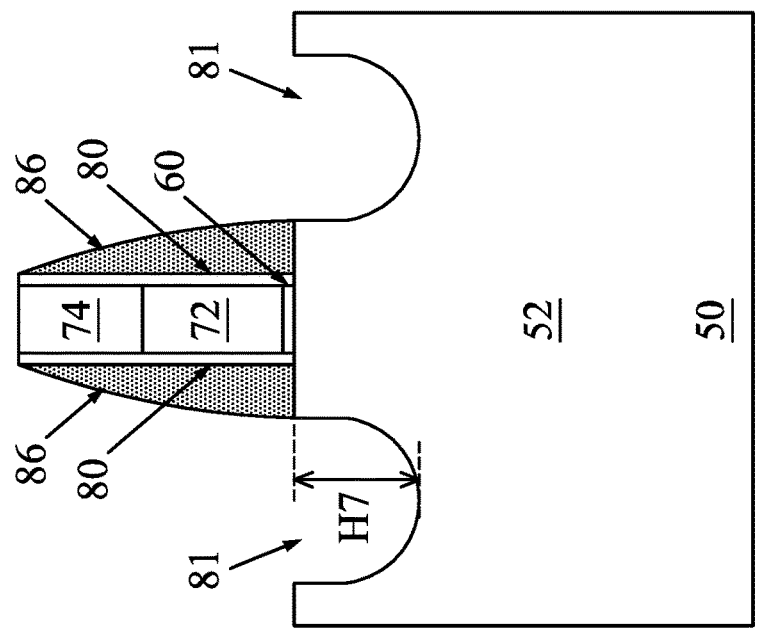
Figure 14A:
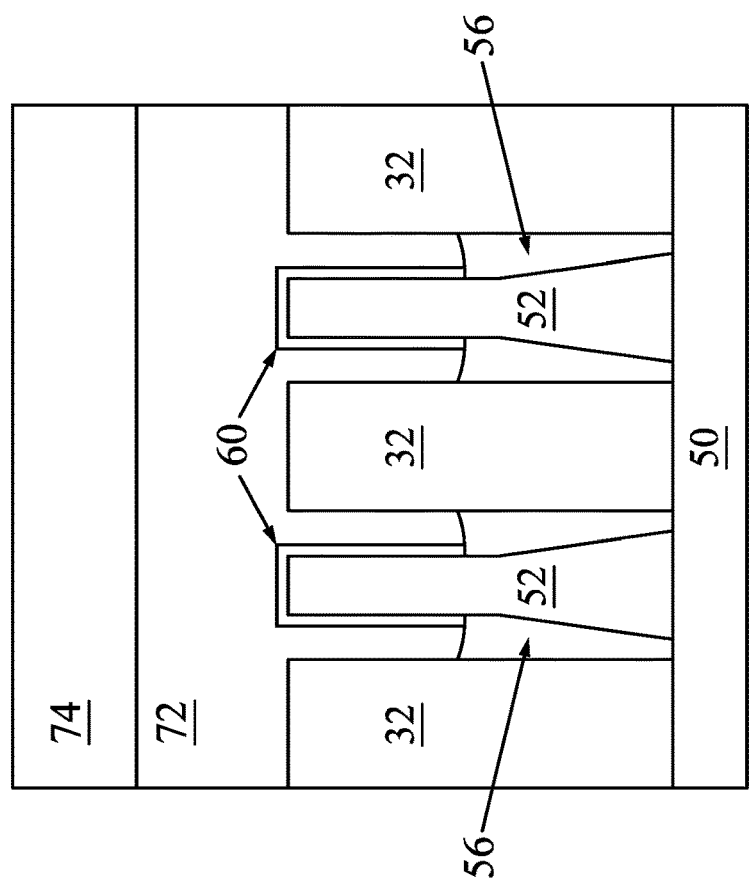
Figure 14C:
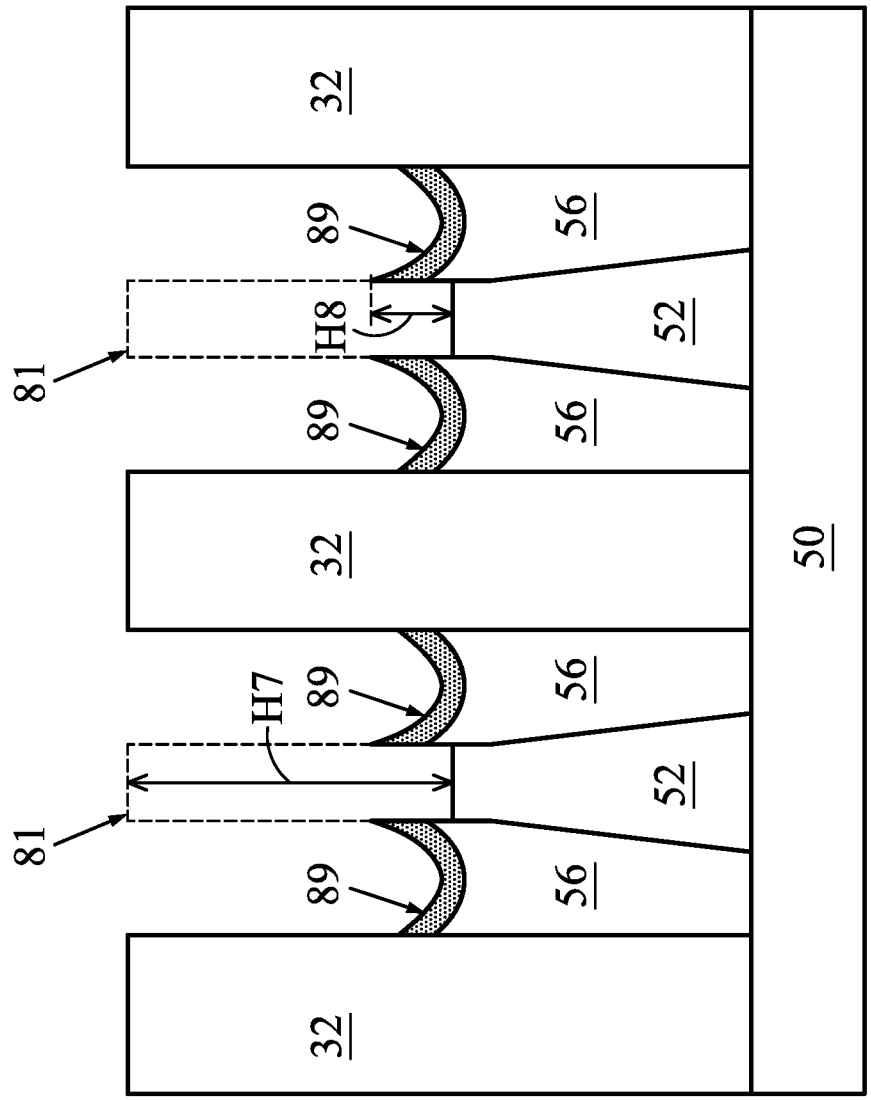

Turning to FIGS. 14A-C, recesses 81 are formed in the fins 52. Epitaxial source/drain regions 82 (see FIGS. 15A-C) are subsequently formed in the recesses 81 of the fins 52, described in greater detail below. During the formation of the recesses 81 in one region (e.g., region 50N or 50P), the other region may be masked by a mask (not shown). As such, recesses 81 for n-type devices (e.g., in region 50N) and/or recesses 81 for p-type devices (e.g., in region 50P) may be formed using the techniques described with respect to FIGS. 14-C. In some embodiments, the recesses 81 may be formed using a suitable anisotropic dry etching process while using the dummy gate stacks 72, the gate spacers 84, dielectric fins 32, and/or spacer regions 89 as a combined mask. In some embodiments, the anisotropic dry etching process may be a plasma etching process including a plasma generated with a power between about 100 Watts and about 2000 Watts. The plasma etching process may be performed at a pressure between about 10 mTorr and about 100 mTorr and at a process temperature between about 20° C. and about 80° C. The plasma etching process may include one or more process gases such as $CF_4$, $CH_2F_2$, $CH_3F$, $CHF_3$, $Cl_2$, Ar, $O_2$, HBr, another type of process gas, or a combination. In some embodiments, the plasma etching process may be performed for a duration of time between about 30 seconds and about 1000 seconds. In some embodiments, process parameters of the plasma etching process may be controlled to control the characteristics of the recesses 81, such as depth, shape, width, or other characteristics. The bottom surfaces of the recesses 81 may be flat, concave, V-shaped, faceted, or have another shape. In some embodiments, the recesses 81 may have a depth H7 from the top surface of the fins 52 that is between about 20 nm and about 80 nm.

As shown in FIG. 14C, the dielectric fins 32 and the spacer regions 89 remain after the recesses 81 have been formed. After forming the recesses 81, sidewalls of the STI regions 56 and/or sidewalls of the spacer regions 89 may be exposed. In some embodiments, a portion of a spacer region 89 adjacent the recess 81 may be a height H8 above a bottom surface of a recess 81 that is between about 5 nm and about 30 nm. The vertical length of the exposed sidewalls of the spacer regions 89 and/or STI regions 56 (i.e., the distance H8) may depend on the depth H7 of the recesses 81, the thickness of the spacer regions 89, and/or the depth H2 of the etching process that forms the STI regions 56 (see FIGS. 9A-B). By controlling the formation of these and other features, the shape and size of the epitaxial source/drain regions 82 and the air gaps 100 (see FIGS. 15A-C) may be controlled.

In FIGS. 15A-D, epitaxial source/drain regions 82 are formed in the recesses 81 of the fins 52. The epitaxial source/drain regions 82 are formed in the fins 52 such that each dummy gate 72 is disposed between respective neighboring pairs of the epitaxial source/drain regions 82. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

Figure 15B:
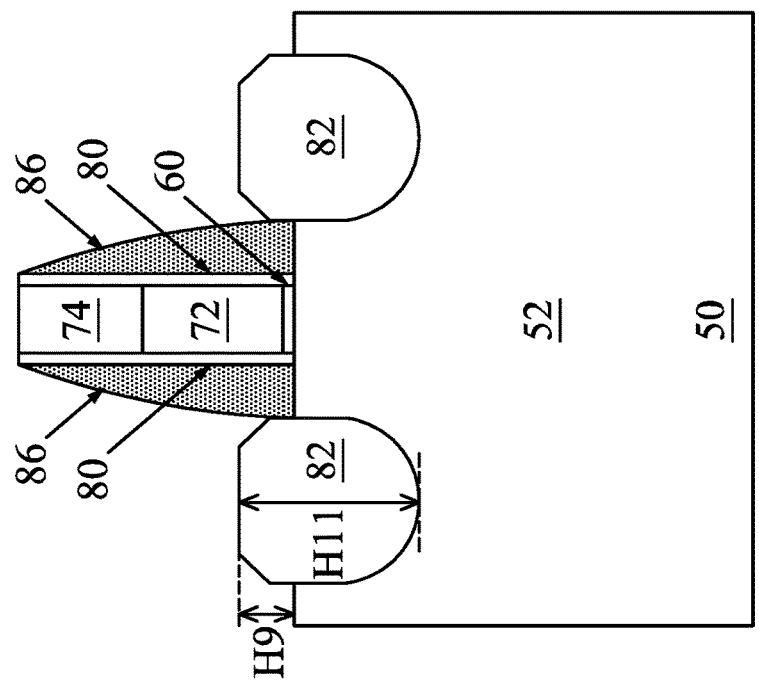
FIGS. 15A, 15B, 15C, and 15D are cross-sectional views of intermediate stages in the manufacturing of epitaxial source/drain regions and air gaps of a FinFET device, in accordance with some embodiments.
Figure 15A:
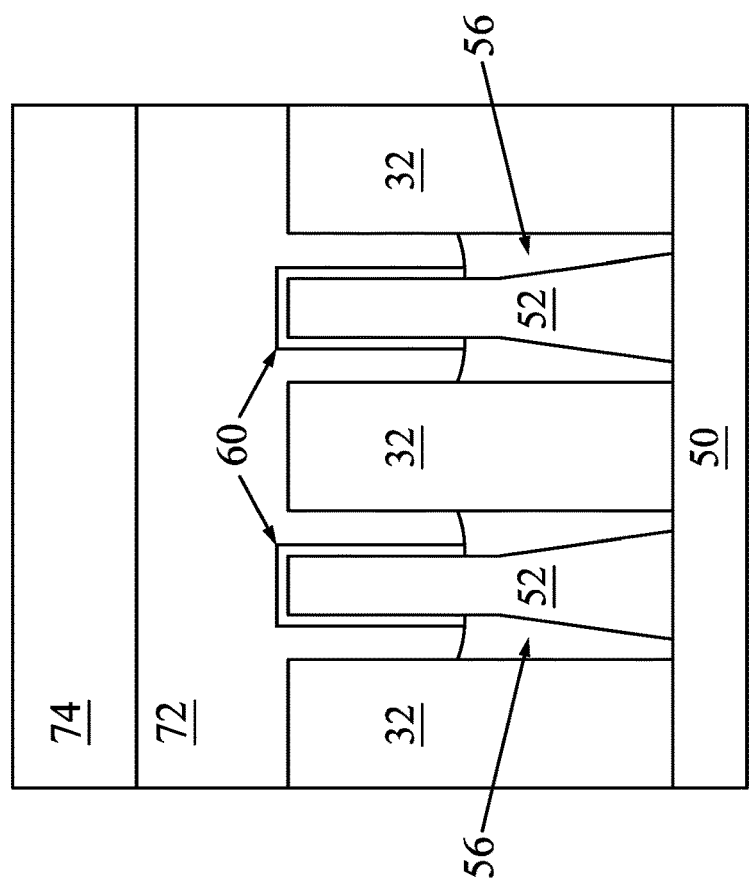
Figure 15C:
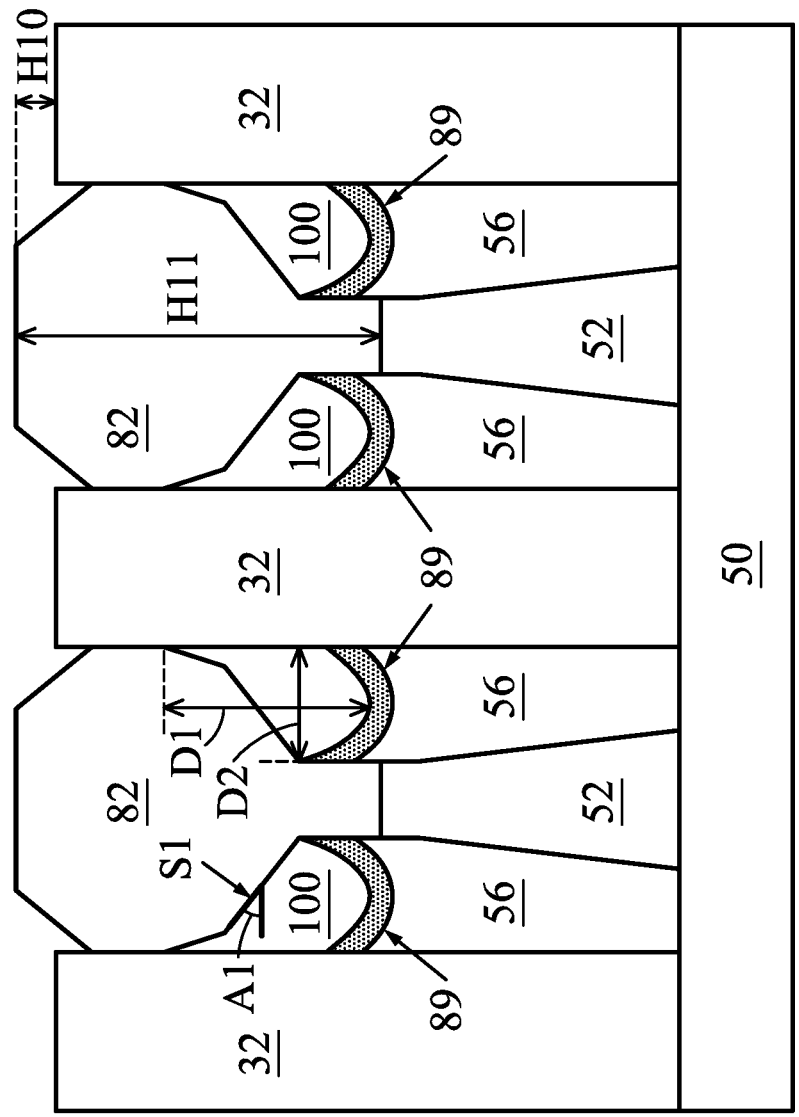

Referring to FIG. 15C, the epitaxial source/drain regions 82 may be grown such that they laterally extend toward the adjacent dielectric fins 32. The height above the bottom surface of the recess 81 at which the lateral growth of the epitaxial source/drain regions 82 begins may be controlled by controlling the vertical length of the exposed sidewalls of the spacer regions 89 and/or STI regions 56 (i.e., the distance H8). In some embodiments, an epitaxial source/drain region 82 may laterally extend such that it contacts both adjacent dielectric fins 32, as shown in FIG. 15C. In this manner, the separation (e.g., W1' shown in FIG. 6) between dielectric fins 32 can be controlled to control the size of the epitaxial source/drain regions 82. In some cases, the dielectric fins 32 may provide support for the epitaxial source/drain regions 82. In some embodiments, an epitaxial source/drain region 82 may laterally extend such that it contacts only one adjacent dielectric fin 32 or does not contact an adjacent dielectric fin 32. In some embodiments, a top surface of the epitaxial source/drain regions 82 may be raised a distance H9 above a top surface of the fins 52 that is between about 0 Å and about 200 Å. In some embodiments, a top surface of the epitaxial source/drain regions 82 may be below a top surface of the fins 52 (not separately illustrated) a distance that is between about 0 Å and about 200 Å. In some embodiments, a top surface of the epitaxial source/drain regions 82 may be raised a distance H10 above a top surface of the dielectric fins 32 that is between about 0 Å and about 200 Å. In some embodiments, a top surface of the epitaxial source/drain regions 82 may be below a top surface of the dielectric fins 32 (not separately illustrated) a distance that is between about 0 Å and about 200 Å. In some embodiments, the epitaxial source/drain regions 82 may have a height H11 that is between about 20 nm and about 100 nm.

Figure 15D:
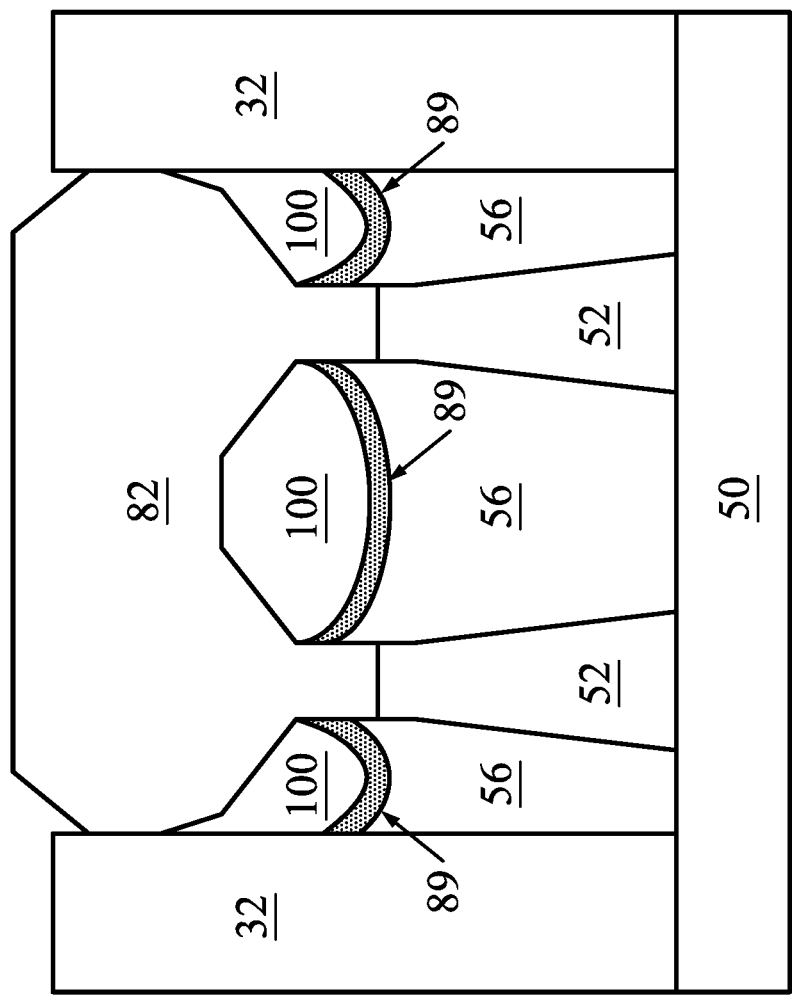

As shown in FIG. 15C, the arrangement of epitaxial source/drain regions 82, dielectric fins 32, STI regions 56, and spacer regions 89 form air gaps 100 between the epitaxial source/drain regions 82 and the STI regions 56. The air gaps 100 may be defined by surfaces of the epitaxial source/drain regions 82, dielectric fins 32, STI regions 56, and/or spacer regions 89. In some embodiments, the air gaps 100 may have a height D1 between about 10 nm and about 50 nm or a width D2 between about 5 nm and about 30 nm. FIG. 15D shows a cross-sectional view of epitaxial source/drain regions 82 similar to that shown in FIG. 15C, except that no dielectric fin 32 is formed between adjacent fins. Thus, as shown in FIG. 15D, the adjacent epitaxial source/drain regions 82 grown on adjacent fins 52 may merge during growth while still allowing formation of air gaps 100. In some embodiments, more than two epitaxial source/drain regions 82 may be merged. In some embodiments having merged epitaxial source/drain regions 82, adjacent fins 52 may be separated by a width between about 5 nm and about 30 nm.

In some embodiments, formation of air gaps 100 may prevent material of the ILD 88 (see FIGS. 16A-C) or other materials from being subsequently formed between the laterally extending portions of the epitaxial source/drain regions 82 and the STI regions 56. Isolating portions of the epitaxial source/drain regions 82 using an air gap 100 instead of using a dielectric material (such as the material of the ILD 88) in this manner may reduce the parasitic capacitance of a FinFET device. This reduction of parasitic capacitance is because the dielectric constant (k) of the air gap 100 may be as low as about k=1.0, whereas other dielectric materials may have a dielectric constant greater than about k=1.0, such as silicon dioxide (about k=3.9). Thus, by at least partially isolating epitaxial source/drain regions 82 with air gaps 100, the overall parasitic capacitance of the device may be reduced. In some cases, the formation of a relatively larger air gap 100 (e.g., having a larger vertical height, lateral width, or overall volume) may reduce parasitic capacitance more than the formation of a relatively smaller air gap 100. In some embodiments, the presence of an air gap 100 as described may reduce the parasitic capacitance of the device an amount between about 2% and about 40%.

The epitaxial source/drain regions 82 in the region 50N, e.g., the NMOS region, may be formed by masking the region 50P, e.g., the PMOS region, and etching source/drain regions of the fins 52 in the region 50N to form recesses 81 in the fins 52. Then, the epitaxial source/drain regions 82 in the region 50N are epitaxially grown in the recesses 81. The epitaxial source/drain regions 82 may include any acceptable material appropriate for n-type FinFETs. For example, if the fin 52 is silicon, the epitaxial source/drain regions 82 in the region 50N may include materials such as silicon, silicon phosphide (SiP), silicon carbide (SiC), SiCP, a combination, or the like. In some cases, the use of SiP for the epitaxial source/drain regions 82 of an n-type FinFET may allow for the epitaxial source/drain regions 82 to be grown having facets with crystalline orientations (described in greater detail below), which can facilitate the formation of the air gaps 100. In some embodiments, the epitaxial source/drain regions 82 in the region 50N may include SiP that is epitaxially grown by flowing silicon precursors and phosphorus precursors into a processing chamber. The silicon precursors may include silane, disilane, trisilane, dichlorosilane, tricholorosilate, the like, or a combination. The phosophorus precursors may include phosphine, phosphorus oxychloride, the like, or a combination. In some embodiments, during the epitaxial growth process, the flow rate of the silicon precursors into the processing chamber is between about 1 and about 5 times the flow rate of the phosphorus precursors into the processing chamber. In some embodiments, the epitaxial growth process is performed using a processing temperature between about 550° C. and about 800° C., or using a process pressure between about 50 torr and about 600 torr. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses 81 in the fins 52. Then, the epitaxial source/drain regions 82 in the region 50P are epitaxially grown in the recesses 81. The epitaxial source/drain regions 82 may include any acceptable material appropriate for p-type FinFETs. For example, if the fin 52 is silicon, the epitaxial source/drain regions 82 in the region 50P may include materials such as silicon, SiGe, SiGeB, Ge, GeSn, or the like. The epitaxial source/drain regions 82 in the region 50P may also have surfaces raised from respective surfaces of the fins 52 (e.g., height H8) and may have facets.

Referring to FIG. 15C, the epitaxial source/drain regions 82 may grow along crystalline orientations such that one or more surfaces of the epitaxial source/drain regions 82 have facets with crystalline orientations. For example, the epitaxial source/drain regions 82 may be grown such that a surface has a (111) crystalline orientation or another crystalline orientation. As an example, the epitaxial source/drain region 82 may have a surface on the underside of the epitaxial source/drain region 82 facing the substrate 50 (i.e., an "undersurface") having a (111) crystalline orientation. An example surface having a crystalline orientation is labeled as surface Si in FIG. 15C. As shown in FIG. 15C, due to the (111) crystalline orientation of the surface S1, the surface Si makes an upward angle A1 with respect to the lateral direction. The upward angle A1 may be between about 25 degrees and about 70 degrees. In this manner, the epitaxial growth along crystalline orientations can cause the epitaxial source/drain regions 82 to grow in the lateral direction toward a dielectric fin 32 at one or more upward angles (e.g., angle A1). By growing the epitaxial source/drain regions 82 with facets having upward angles, distances between undersurfaces of the epitaxial source/drain regions 82 and the spacer regions 89 can be increased. In this manner, air gaps 100 having a larger volume or a larger surface area can be formed, which can reduce the parasitic capacitance of the device as described previously.

The epitaxial source/drain regions 82 and/or the fins 52 may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

Figure 16B:
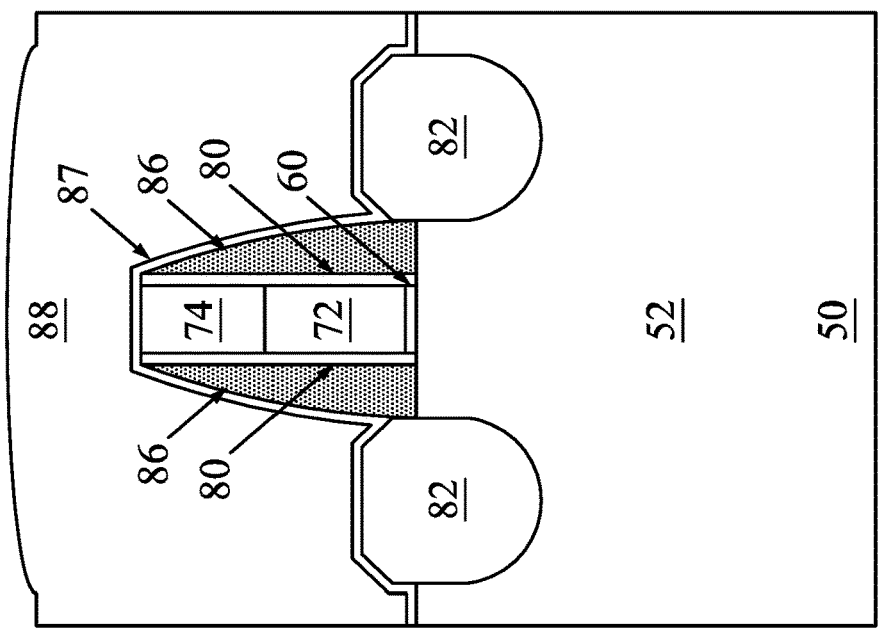
Figure 16A:
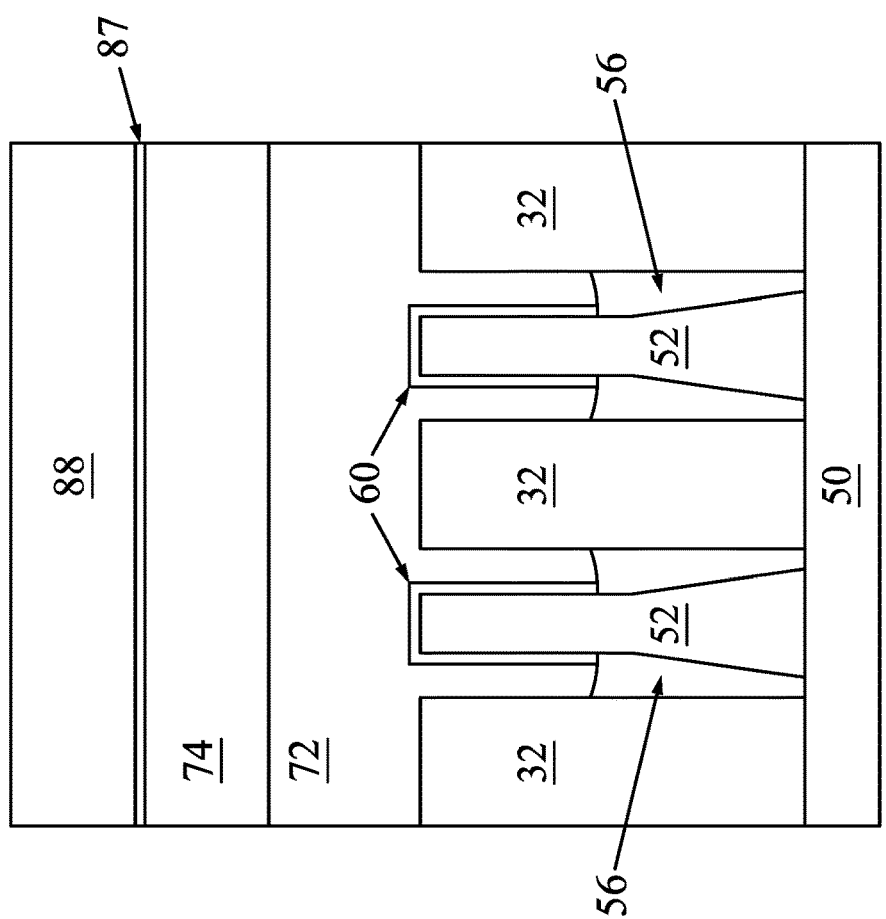
Figure 16C:
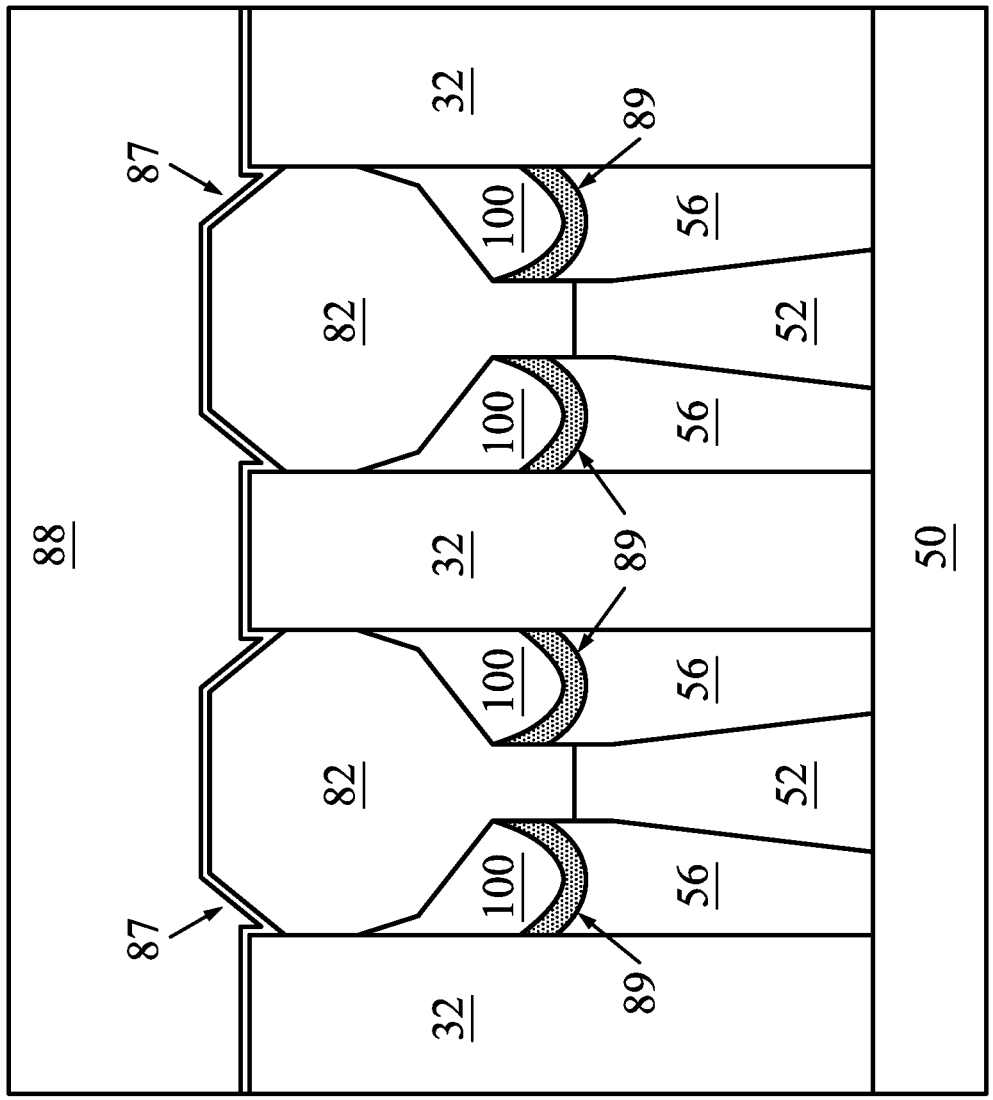

Turning to FIGS. 16A-C, an ILD 88 is deposited over the region 50N and the region 50P. The ILD 88 may be formed of a dielectric material or a semiconductor material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), silicon oxide, silicon nitride, the like, or a combination. Semiconductor materials may include amorphous silicon, silicon germanium ($Si_xGe_{1-x}$, where x can be between approximately 0 and 1), pure germanium, or the like. Other insulation or semiconductor materials formed by any acceptable process may be used. In some embodiments, a contact etch stop layer (CESL) 87 is disposed between the ILD 88 and the epitaxial source/drain regions 82, the masks 74, and the gate spacers 86. The CESL 87 may comprise a dielectric material such as silicon nitride, silicon oxide, silicon oxynitride, the like, or a combination thereof. Because the epitaxial source/drain regions 82 extend between dielectric fins 32, the epitaxial source/drain regions 82 block material of the ILD 88 or the CESL 87 from being formed in the air gaps 100 beneath the epitaxial source/drain regions 82. In this manner, the air gaps 100 may remain sealed beneath the epitaxial source/drain regions 82, and thus material is prevented from being subsequently deposited within the air gaps 100.

Figure 17C:
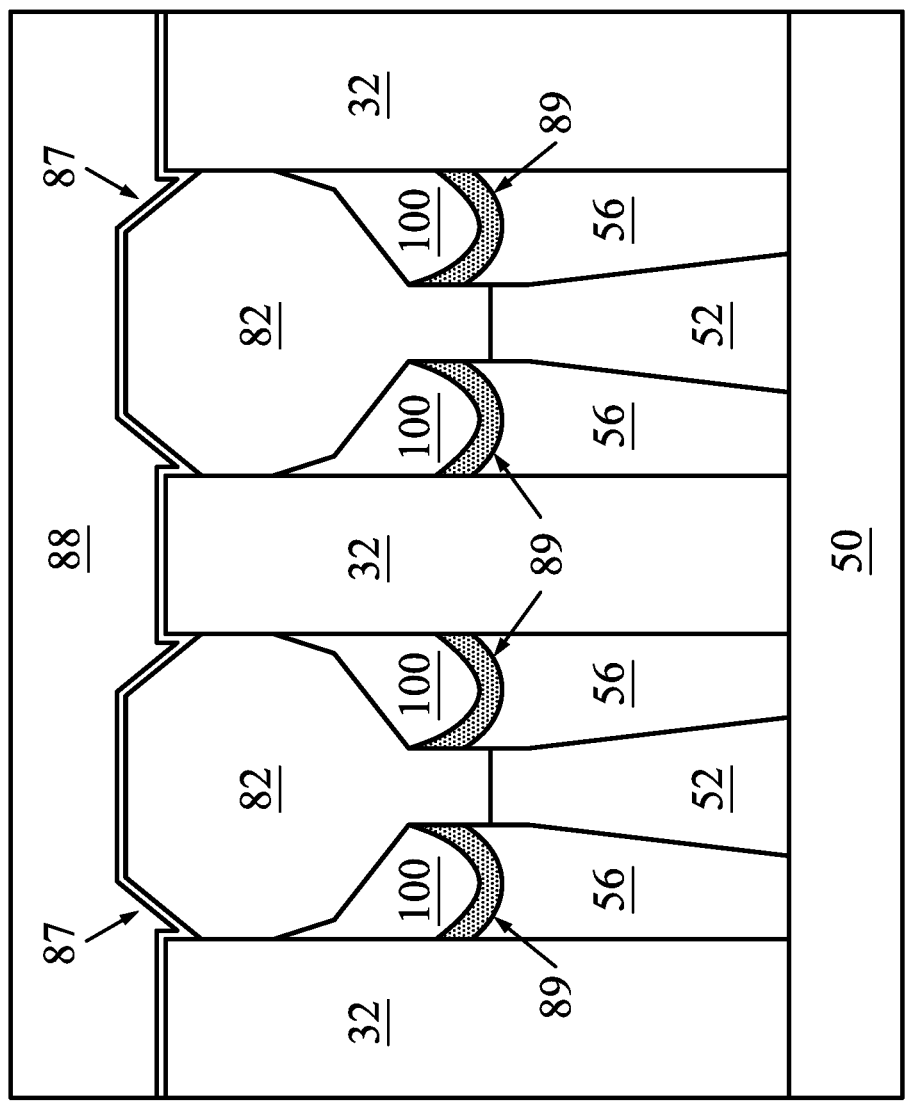

In FIGS. 17A-C, a planarization process, such as a CMP, may be performed to level the top surface of the ILD 88 with the top surfaces of the dummy gates 72. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the ILD 88 are level. Accordingly, the top surfaces of the dummy gates 72 are exposed through the ILD 88.

In FIGS. 18A-B, the dummy gates 72 and portions of the dummy dielectric layer 60 directly underlying the exposed dummy gates 72 are removed in one or more etching steps, so that recesses 90 are formed. In some embodiments, the dummy gates 72 are removed by an anisotropic dry etch process. For example, the etching process may include a dry etch process using one or more process gases that selectively etch the dummy gates 72 without etching the ILD 88 or the gate spacers 86. Each recess 90 exposes a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 19B:
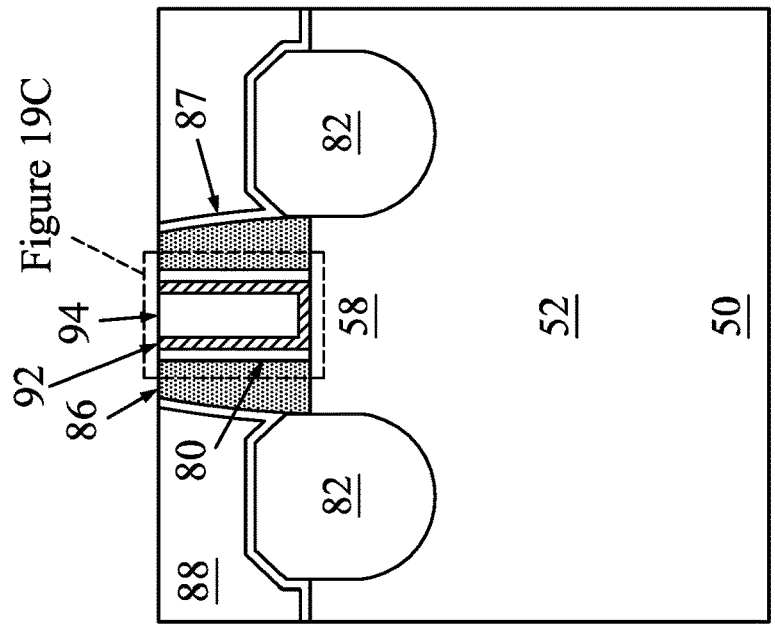
Figure 19A:
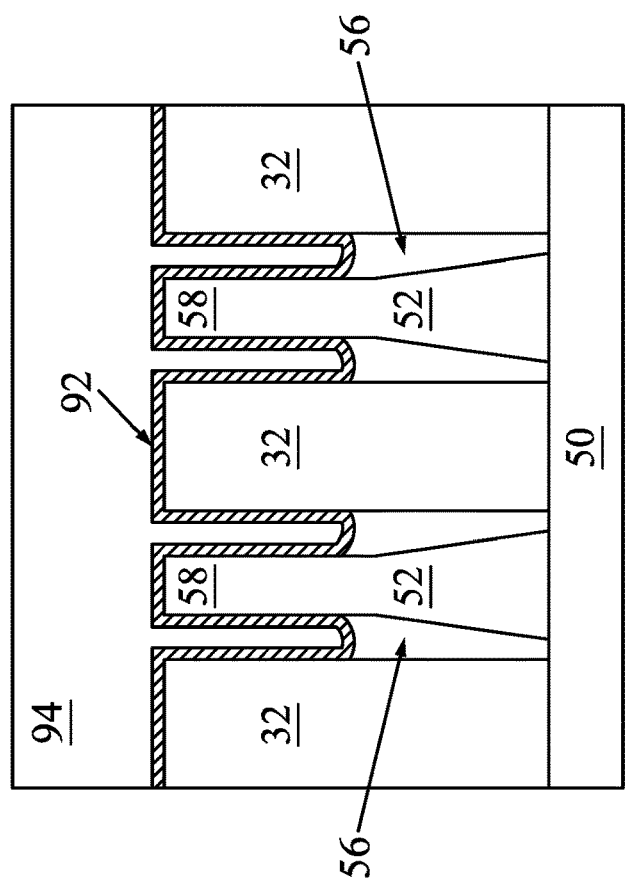
Figure 19C:
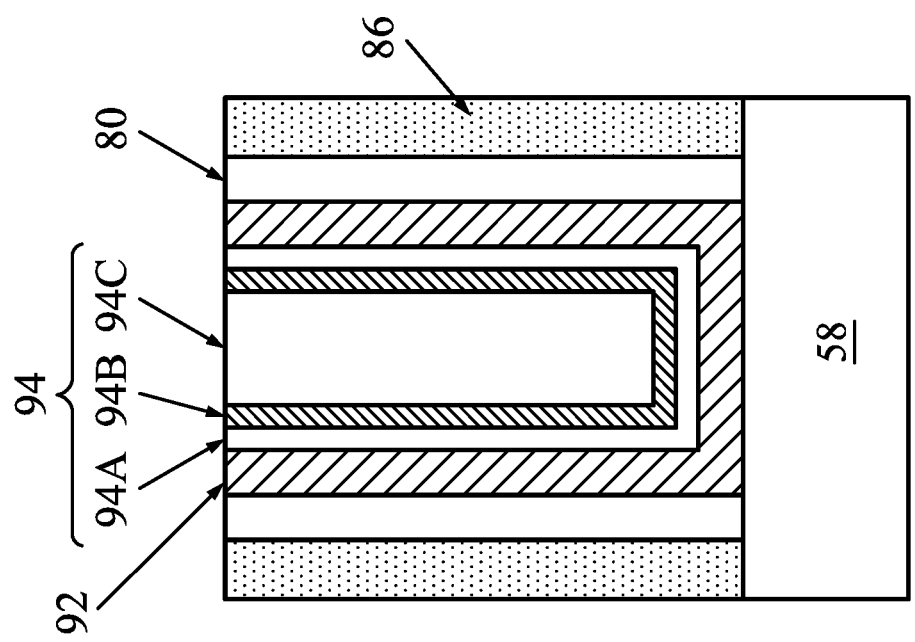

In FIGS. 19A-C, gate dielectric layers 92 and gate electrodes 94 are formed for replacement gates, in accordance with some embodiments. FIG. 19C illustrates a detailed close-up view of FIG. 19B, as indicated. Gate dielectric layers 92 are deposited conformally in the recesses 90, such as on the top surfaces and the sidewalls of the fins 52 and on sidewalls of the gate seal spacers 80. The gate dielectric layers 92 may also be formed on top surface of the first ILD 88. In accordance with some embodiments, the gate dielectric layers 92 comprise silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like. In embodiments in which portions of the dummy gate dielectric 60 remains in the recesses 90, the gate dielectric layers 92 include a material of the dummy gate dielectric 60 (e.g., silicon oxide).

The gate electrodes 94 are deposited over the gate dielectric layers 92, respectively, and fill the remaining portions of the recesses 90. The gate electrodes 94 may be a metal-containing material such as TiN, TiO, TaN, TaC, Co, Ru, Al, W, combinations thereof, or multi-layers thereof. For example, although a single layer gate electrode 94 is illustrated in FIG. 19B, the gate electrode 94 may comprise any number of liner layers 94A, any number of work function tuning layers 94B, and a fill material 94C as illustrated by FIG. 19C. After the filling of the gate electrodes 94, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 20B:
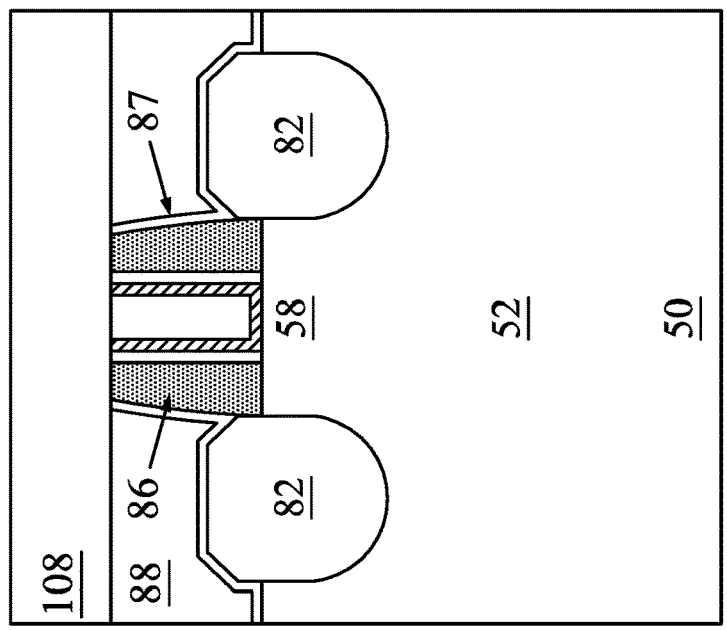
Figure 20A:
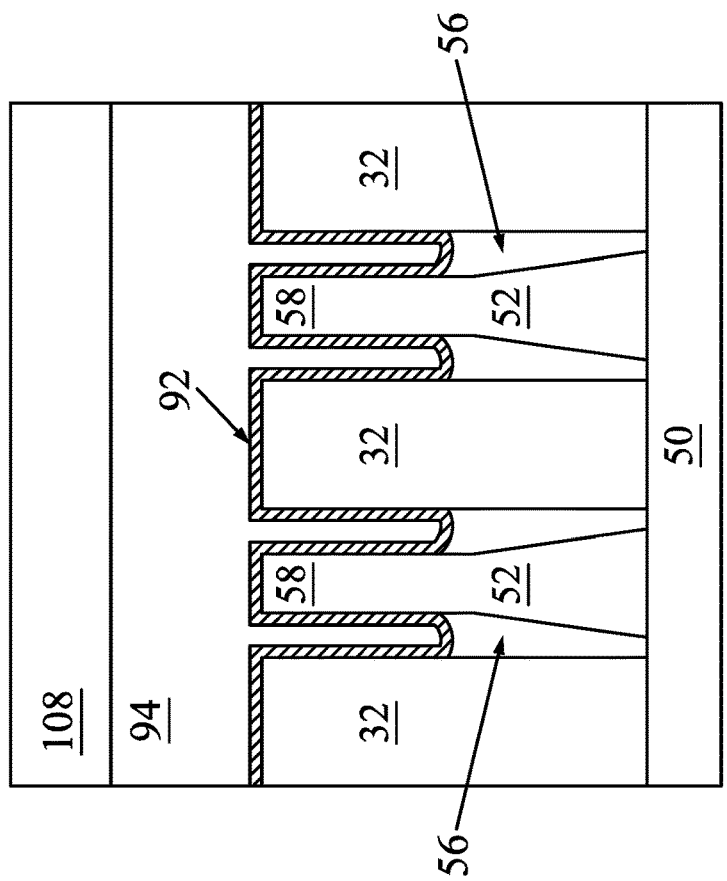
Figure 20C:
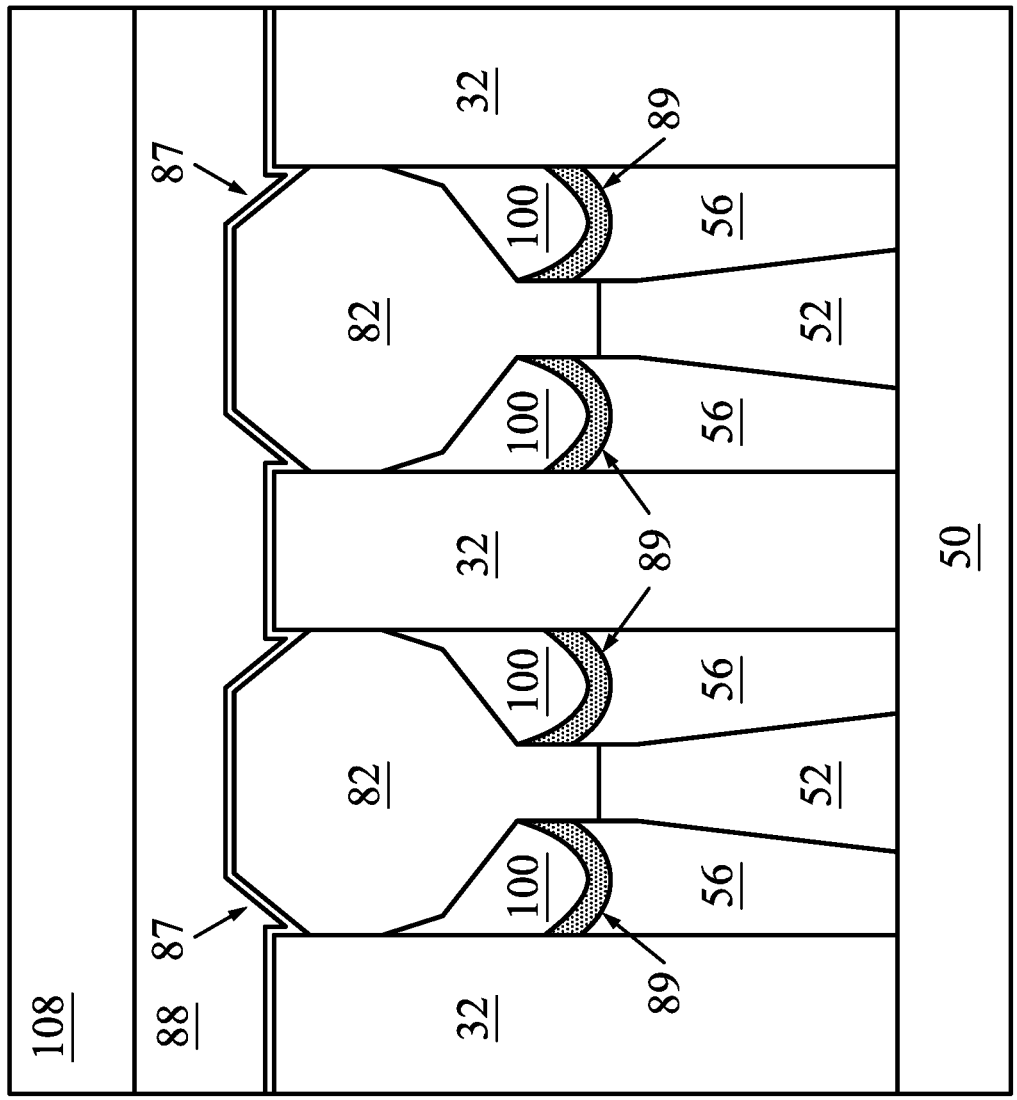

In FIGS. 20A-C, an ILD 108 is deposited over the ILD 88. In an embodiment, the ILD 108 is a flowable film formed by a flowable CVD method. In some embodiments, the ILD 108 is formed of a dielectric material such as PSG, BSG, BPSG, USG, or the like, and may be deposited by any suitable method, such as CVD, PE-CVD, or the like.

Figure 21B:
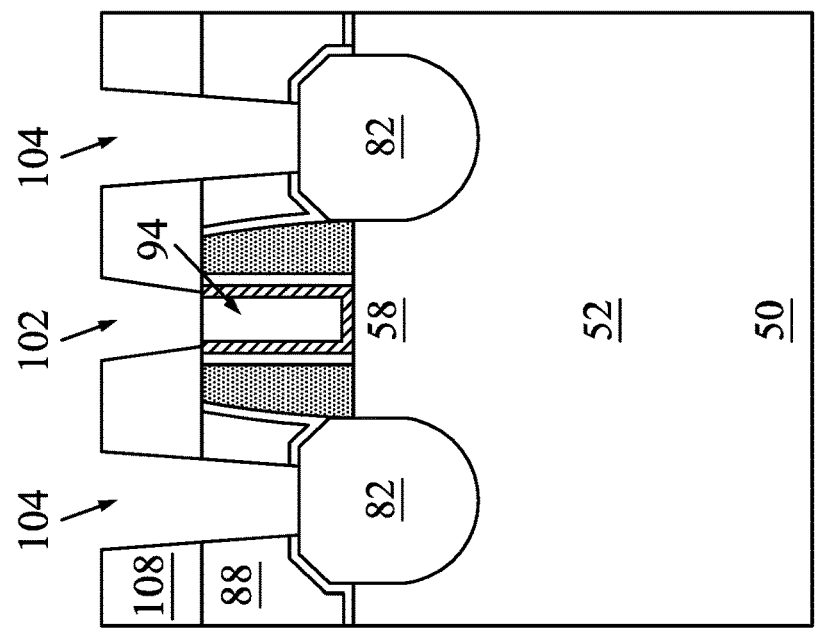
Figure 21A:
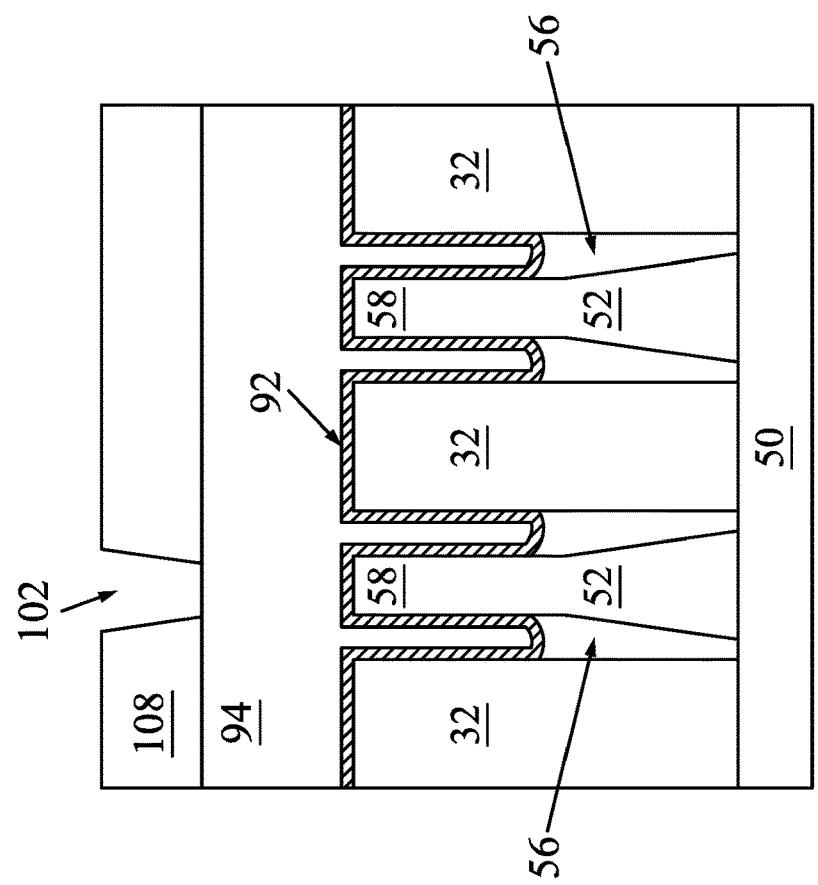
Figure 21C:
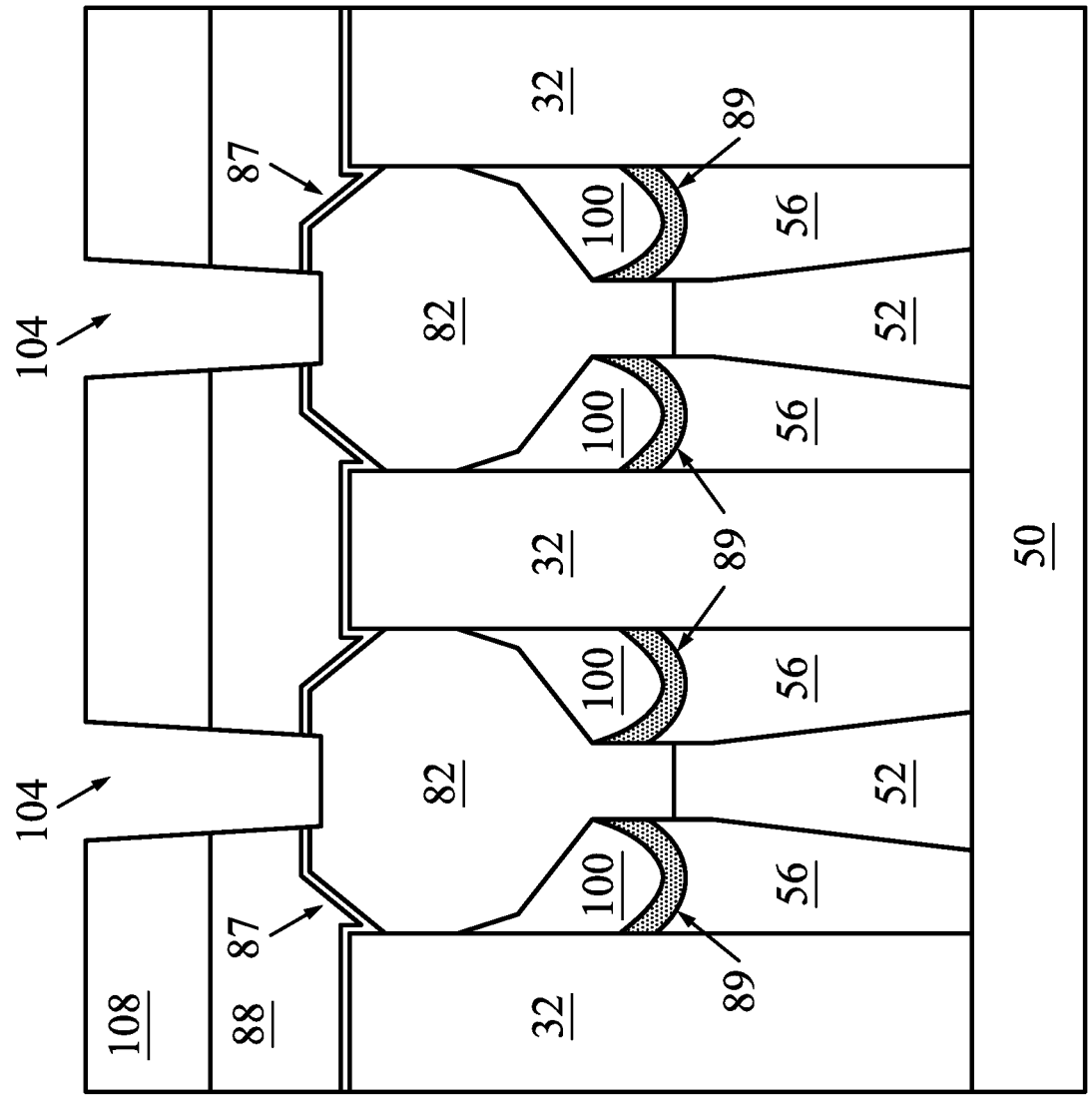

In FIGS. 21A-C, openings 102 and 104 are formed in the ILD 108 and ILD 88 to expose the gate electrode 94 and the epitaxial source/drain regions 82, respectively. The openings 102 and 104 may be formed using a suitable photolithography and etching process. For example, a patterned mask may be formed over the ILD 108, and a suitable anisotropic dry etching process used to etch the ILD 108 and ILD 88. The openings 102 may be formed prior to, simultaneously with, or after the openings 104.

Figure 22B:
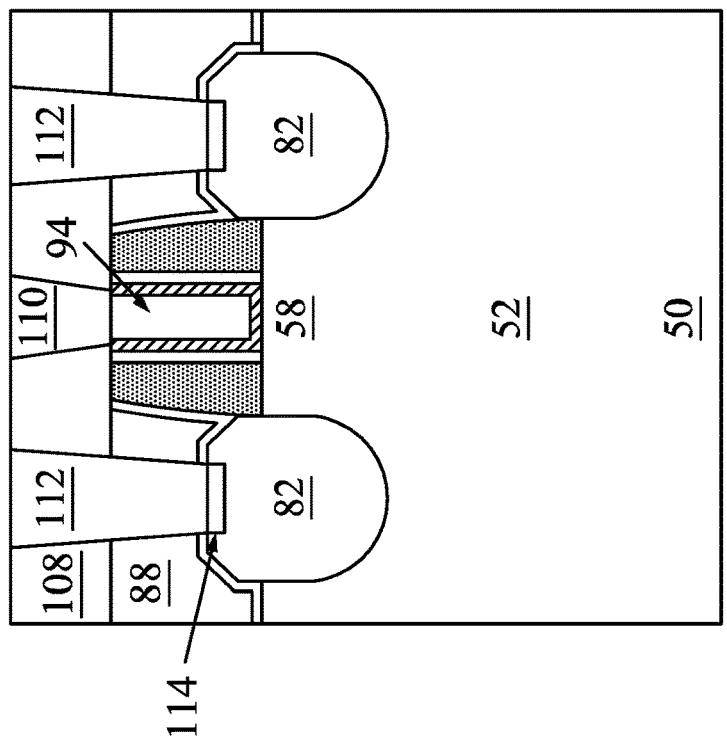
Figure 22A:
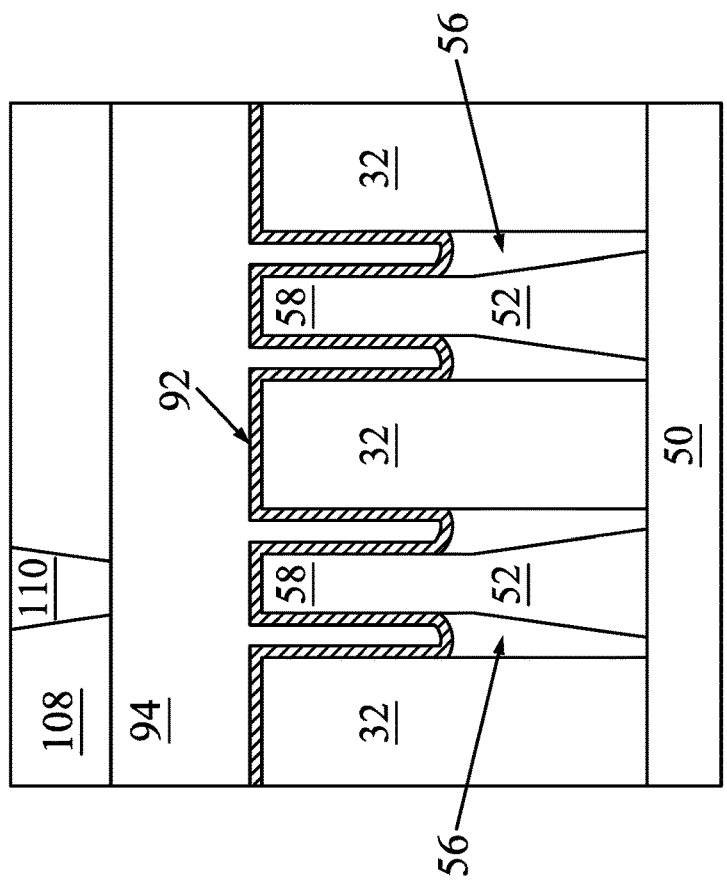
Figure 22C:
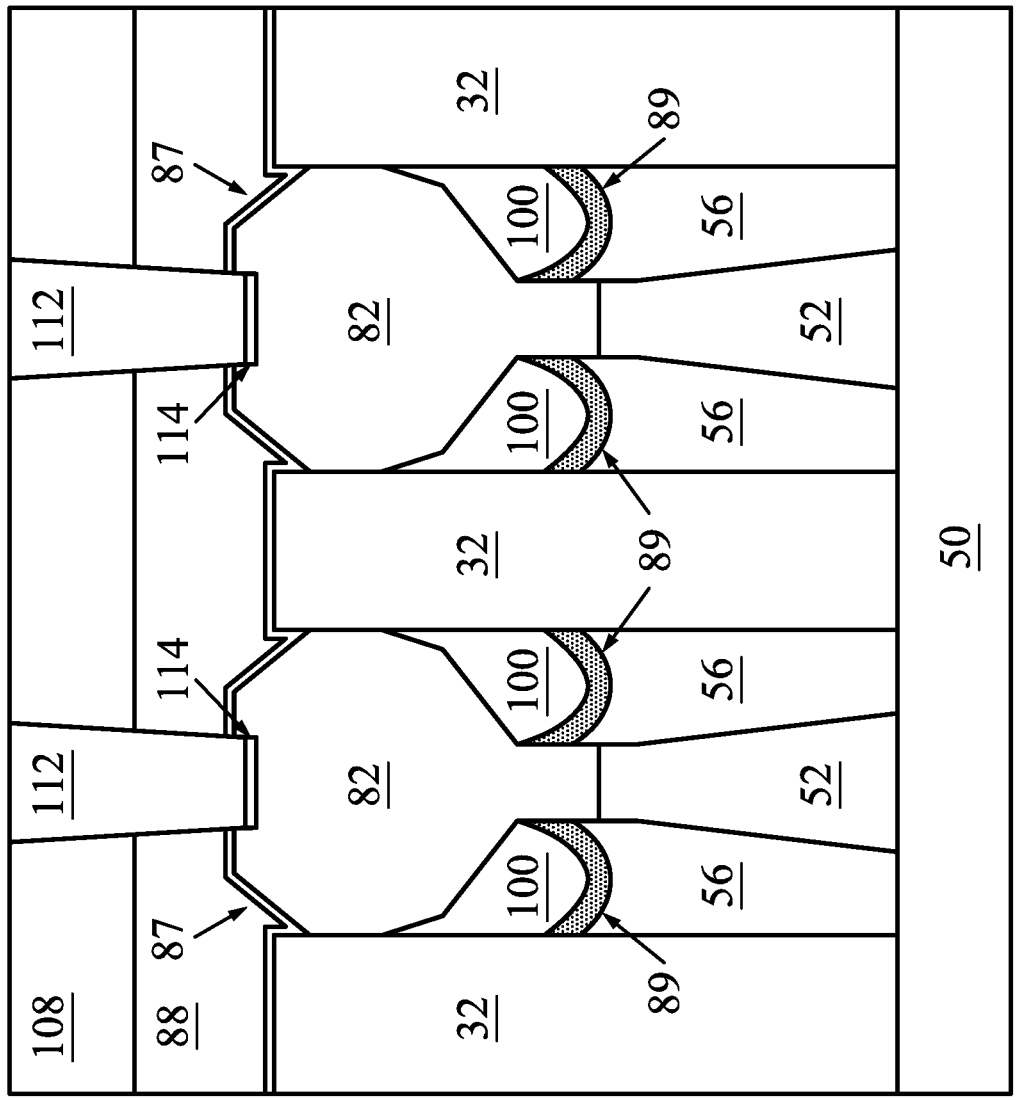

In FIGS. 22A-C, contacts 110 and 112 are formed through the ILD 108 and the ILD 88, in accordance with some embodiments. A liner, such as a diffusion barrier layer, an adhesion layer, or the like, and a conductive material are formed in the openings 102 and 104. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. In some embodiments, an anneal process may be performed to form a silicide 114 at the interface between the epitaxial source/drain regions 82 and the contacts 112 prior to the contacts 112 being formed. The contact 110 is physically and electrically connected to the gate electrode 94, and the contacts 112 are physically and electrically connected to the epitaxial source/drain regions 82. FIGS. 22A-B illustrate the contacts 110 and 112 in a same cross-section; however, in other embodiments, the contacts 110 and 112 may be disposed in different cross-sections. Further, the positions of contacts 110 and 112 in FIGS. 22A-B are merely illustrative and not intended to be limiting in any way. For example, the contact 110 may be vertically aligned with the fin 52 as illustrated or may be disposed at a different location on the gate electrode 94. Furthermore, the contacts 112 or openings 104 may be formed prior to, simultaneously with, or after forming the contacts 110 or openings 102.

The embodiments described herein may achieve advantages. For example, by forming dielectric fins disposed on either side of a semiconductor fin, an epitaxial source/drain region may be grown that extends from one dielectric fin to another, forming one or more air gaps (e.g., gaps or voids) beneath the underside of the epitaxial source/drain region. In this manner, the epitaxial source/drain region may block subsequently deposited material from being deposited beneath the underside of the epitaxial source/drain region. The epitaxial source/drain regions are thus partially isolated by the air gaps, which can reduce the parasitic capacitance of the device (e.g., a FinFET device). By reducing the parasitic capacitance, the device performance may be improved. For example, the device may have improved response to signals with less noise, particularly at higher frequencies.

In accordance with an embodiment, a method includes forming a semiconductor fin over a substrate, depositing a sacrificial layer over the semiconductor fin, depositing a first dielectric material over the sacrificial layer and over the substrate, removing the sacrificial layer, the remaining first dielectric material forming a first dielectric fin over the substrate, wherein the first dielectric fin is on a first side of the semiconductor fin, forming a first isolation region extending between the semiconductor fin and the first dielectric fin, forming a dummy gate structure over a first portion of the semiconductor fin, recessing a second portion of the semiconductor fin adjacent the dummy gate structure to form a first recess, performing an epitaxy process to form a epitaxial source/drain region in the first recess, wherein performing the epitaxy process forms an air gap between the epitaxial source/drain region and the first isolation region, and depositing an insulating material over the epitaxial source/drain region, wherein after depositing the insulating material, an air gap is maintained between the epitaxial source/drain region and the first isolation region. In an embodiment, the method further includes before performing the epitaxy process, depositing a second dielectric material over the first isolation region. In an embodiment, after recessing the semiconductor fin, a bottom surface of the first recess is closer to the substrate than a top surface of the second dielectric material. In an embodiment, the second dielectric material is deposited on sidewalls of the semiconductor fin. In an embodiment, the first dielectric material has a different composition than the second dielectric material. In an embodiment, the method further includes forming a second dielectric fin over the substrate, wherein the first dielectric fin and the second dielectric fin are on opposing sides of the semiconductor fin. In an embodiment, a distance between the first dielectric fin and the second dielectric fin is between 30 nm and 100 nm. In an embodiment, the first isolation region has a concave top surface. In an embodiment, the epitaxial source/drain region physically contacts the first dielectric fin. In an embodiment, an undersurface of the epitaxial source/drain region includes a facet having a (111) crystalline orientation.

In accordance with an embodiment, a method includes patterning a substrate to form a semiconductor strip, forming a first dielectric strip and a second dielectric strip over the substrate, wherein the semiconductor strip is disposed between the first dielectric strip and the second dielectric strip, forming an isolation region between the semiconductor strip and the first dielectric strip and between the semiconductor strip and the second dielectric strip, wherein an upper portion of the semiconductor strip extends above a top surface of the isolation region, forming a dummy structure along sidewalls and a top surface of the upper portion of the semiconductor strip, performing an etching process on the upper portion of the semiconductor strip to form a recess in the semiconductor strip, and epitaxially growing a source/drain region in the recess, wherein a first portion of the source/drain region extends in a first lateral direction to the first dielectric strip and a second portion of the source/drain region extends in a second lateral direction to the second dielectric strip, and wherein a first air gap is formed between the first portion of the source/drain region and the isolation region and a second air gap is formed between the second portion of the source/drain region and the isolation region. In an embodiment, the method includes depositing a spacer material over the sidewalls of the dummy structure and over the isolation region. In an embodiment, the source/drain region comprises silicon phosphide. In an embodiment, the first air gap extends a vertical distance between 50 Å and 300 Å. In an embodiment, the first air gap extends laterally from the first dielectric strip to the source/drain region and the second air gap extends laterally from the second dielectric strip to the source/drain region. In an embodiment, the recess in the semiconductor strip has a bottom surface that is closer to the substrate than a top surface of the isolation region. In an embodiment, a lateral distance between the semiconductor strip and an adjacent dielectric strip is between 50 Å and 300 Å.

In accordance with an embodiment, a semiconductor device includes a first semiconductor fin extending from a substrate, a first dielectric fin extending from the substrate adjacent a first side of the first semiconductor fin and a second dielectric fin extending from the substrate adjacent a second side of the first semiconductor fin, a first gate stack over and along sidewalls of the first semiconductor fin, the first dielectric fin, and the second dielectric fin, a first epitaxial source/drain region in the first semiconductor fin and extending from the first dielectric fin to the second dielectric fin, and an air gap between the first epitaxial source/drain region and the substrate, the air gap extending between the first dielectric fin and the second dielectric fin. In an embodiment, the semiconductor device includes an insulating material disposed over the substrate, wherein the air gap extends from the first epitaxial source/drain region to the insulating material. In an embodiment, the semiconductor device includes a spacer material on sidewalls of the first gate stack and on the insulating material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a semiconductor fin over a substrate;
    depositing a sacrificial layer over the semiconductor fin;
    depositing a first dielectric material over the sacrificial layer and over the substrate;
    removing the sacrificial layer, the remaining first dielectric material forming a first dielectric fin over the substrate, wherein the first dielectric fin is on a first side of the semiconductor fin;
    forming a first isolation region extending between the semiconductor fin and the first dielectric fin;
    forming a dummy gate structure over a first portion of the semiconductor fin;
    recessing a second portion of the semiconductor fin adjacent the dummy gate structure to form a first recess;
    performing an epitaxy process to form a epitaxial source/drain region in the first recess, wherein performing the epitaxy process forms an air gap between the epitaxial source/drain region and the first isolation region; and
    depositing an insulating material over the epitaxial source/drain region, wherein after depositing the insulating material, an air gap is maintained between the epitaxial source/drain region and the first isolation region.

2. The method of claim 1, further comprising, before performing the epitaxy process, depositing a second dielectric material over the first isolation region.

3. The method of claim 2, wherein after recessing the semiconductor fin, a bottom surface of the first recess is closer to the substrate than a top surface of the second dielectric material.

4. The method of claim 2, wherein the second dielectric material is deposited on sidewalls of the semiconductor fin.

5. The method of claim 2, wherein the first dielectric material has a different composition than the second dielectric material.

6. The method of claim 1, further comprising forming a second dielectric fin over the substrate, wherein the first dielectric fin and the second dielectric fin are on opposing sides of the semiconductor fin.

7. The method of claim 6, wherein a distance between the first dielectric fin and the second dielectric fin is between 30 nm and 100 nm.

8. The method of claim 1, wherein the first isolation region has a concave top surface.

9. The method of claim 1, wherein the epitaxial source/drain region physically contacts the first dielectric fin.

10. The method of claim 1, wherein an undersurface of the epitaxial source/drain region comprises a facet having a (111) crystalline orientation.

11. A method comprising:
    patterning a substrate to form a semiconductor strip;
    forming a first dielectric strip and a second dielectric strip over the substrate, wherein the semiconductor strip is disposed between the first dielectric strip and the second dielectric strip;
    forming an isolation region between the semiconductor strip and the first dielectric strip and between the semiconductor strip and the second dielectric strip, wherein an upper portion of the semiconductor strip extends above a top surface of the isolation region;
    forming a dummy structure along sidewalls and a top surface of the upper portion of the semiconductor strip;
    performing an etching process on the upper portion of the semiconductor strip to form a recess in the semiconductor strip; and
    epitaxially growing a source/drain region in the recess, wherein a first portion of the source/drain region extends in a first lateral direction to the first dielectric strip and a second portion of the source/drain region extends in a second lateral direction to the second dielectric strip, and wherein a first air gap is formed between the first portion of the source/drain region and the isolation region and a second air gap is formed between the second portion of the source/drain region and the isolation region.

12. The method of claim 11, further comprising depositing a spacer material over the sidewalls of the dummy structure and over the isolation region.

13. The method of claim 11, wherein the source/drain region comprises silicon phosphide.

14. The method of claim 11, wherein the first air gap extends a vertical distance between 50 Å and 300 Å.

15. The method of claim 11, wherein the first air gap extends laterally from the first dielectric strip to the source/drain region and the second air gap extends laterally from the second dielectric strip to the source/drain region.

16. The method of claim 11, wherein the recess in the semiconductor strip has a bottom surface that is closer to the substrate than a top surface of the isolation region.

17. The method of claim 11, wherein a lateral distance between the semiconductor strip and an adjacent dielectric strip is between 50 Å and 300 Å.

18. A semiconductor device comprising:
    a first semiconductor fin extending from a substrate;
    a first dielectric fin extending from the substrate adjacent a first side of the first semiconductor fin and a second dielectric fin extending from the substrate adjacent a second side of the first semiconductor fin;
    a first gate stack over and along sidewalls of the first semiconductor fin, the first dielectric fin, and the second dielectric fin;
    a first epitaxial source/drain region in the first semiconductor fin and extending from the first dielectric fin to the second dielectric fin; and
    an air gap between the first epitaxial source/drain region and the substrate, the air gap extending between the first dielectric fin and the second dielectric fin.

19. The semiconductor device of claim 18, further comprising an insulating material disposed over the substrate, wherein the air gap extends from the first epitaxial source/drain region to the insulating material.

20. The semiconductor device of claim 19, further comprising a spacer material on sidewalls of the first gate stack and on the insulating material.

* * * * *